(12) United States Patent
Iwakura et al.

(10) Patent No.: US 9,728,685 B2
(45) Date of Patent: Aug. 8, 2017

(54) LIGHT EMITTING DEVICE AND LIGHTING DEVICE INCLUDING SAME

(71) Applicant: NICHIA CORPORATION, Anan-shi (JP)

(72) Inventors: Daisuke Iwakura, Komatsushima (JP); Yusaku Achi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/192,766

(22) Filed: Feb. 27, 2014

(65) Prior Publication Data
US 2014/0239332 A1 Aug. 28, 2014

(30) Foreign Application Priority Data

Feb. 28, 2013 (JP) ................. 2013-038159
Jun. 28, 2013 (JP) ................. 2013-137499
Jan. 29, 2014 (JP) ................. 2014-013925

(51) Int. Cl.
*H01L 33/00* (2010.01)
*H01L 33/50* (2010.01)
*H01L 33/54* (2010.01)
*H01L 25/075* (2006.01)

(52) U.S. Cl.
CPC ............ *H01L 33/50* (2013.01); *H01L 33/505* (2013.01); *H01L 33/508* (2013.01); *H01L 33/54* (2013.01); *H01L 25/0753* (2013.01); *H01L 2224/13* (2013.01); *H01L 2224/45144* (2013.01); *H01L 2224/48091* (2013.01); *H01L 2224/48137* (2013.01); *H01L 2224/73265* (2013.01); *H01L 2224/8592* (2013.01)

(58) Field of Classification Search
CPC ........ H01L 33/50; H01L 33/505; H01L 33/54

USPC ................... 257/98, 100, E33.061
See application file for complete search history.

(56) References Cited

U.S. PATENT DOCUMENTS

| 6,351,069 | B1* | 2/2002 | Lowery ................. H01L 33/504 313/501 |
| 7,926,973 | B2* | 4/2011 | Harada ............... H01L 25/0753 362/231 |
| 2006/0027803 | A1 | 2/2006 | Lu et al. |
| 2006/0035419 | A1 | 2/2006 | Lu et al. |
| 2006/0193121 | A1* | 8/2006 | Kamoshita ........... H01L 33/508 362/84 |
| 2008/0054279 | A1 | 3/2008 | Hussell et al. |
| 2008/0157065 | A1 | 7/2008 | Krishnamoorthy et al. |
| 2008/0218072 | A1 | 9/2008 | Haruna et al. |
| 2009/0134414 | A1* | 5/2009 | Li .......................... B29C 39/006 257/98 |
| 2009/0236622 | A1* | 9/2009 | Nishihara ............. H01L 33/504 257/98 |
| 2010/0237370 | A1 | 9/2010 | Kim et al. |
| 2011/0171447 | A1 | 7/2011 | Krishnamoorthy et al. |

(Continued)

FOREIGN PATENT DOCUMENTS

JP  S53-080988 A  7/1978
JP  S59-101881 A  6/1984

(Continued)

*Primary Examiner* — Jamie C Niesz
(74) *Attorney, Agent, or Firm* — Foley & Lardner LLP

(57) ABSTRACT

A light emitting device includes a base that has an element mounting surface, a light emitting element that is mounted on the element mounting surface and that has maximum light intensity in a directly upward direction, and a coating member that contains a fluorescent body that is excited by light from the light emitting element, and that is constituted by a single layer that coats an upper part of the light emitting element. The fluorescent body exists at a position other than directly above the light emitting element.

9 Claims, 20 Drawing Sheets

(56) References Cited

U.S. PATENT DOCUMENTS

| | | | | |
|---|---|---|---|---|
| 2012/0019123 A1* | 1/2012 | Furukawa | ............... | H01L 33/54 |
| | | | | 313/483 |
| 2012/0112623 A1 | 5/2012 | Kobashi | | |
| 2013/0062649 A1* | 3/2013 | Hata | ..................... | H01L 33/501 |
| | | | | 257/98 |
| 2014/0239325 A1* | 8/2014 | Andrews | ................ | H01L 33/60 |
| | | | | 257/98 |

FOREIGN PATENT DOCUMENTS

| | | |
|---|---|---|
| JP | H11-284234 A | 10/1999 |
| JP | 2000-244021 A | 9/2000 |
| JP | 2003-249689 A | 9/2003 |
| JP | 2005-347467 A | 12/2005 |
| JP | 2006-128266 A | 5/2006 |
| JP | 2006-135300 A | 5/2006 |
| JP | 2006-245020 A | 9/2006 |
| JP | 2006-324408 A | 11/2006 |
| JP | 2008-103688 A | 5/2008 |
| JP | 2008-218511 A | 9/2008 |
| JP | 2009-170825 A | 7/2009 |
| JP | 2010-532792 A | 10/2010 |
| JP | 2010-538453 A | 12/2010 |
| JP | 2012-114416 A | 6/2012 |
| JP | 2012-142430 A | 7/2012 |
| WO | WO-2008/124711 A1 | 10/2008 |

\* cited by examiner

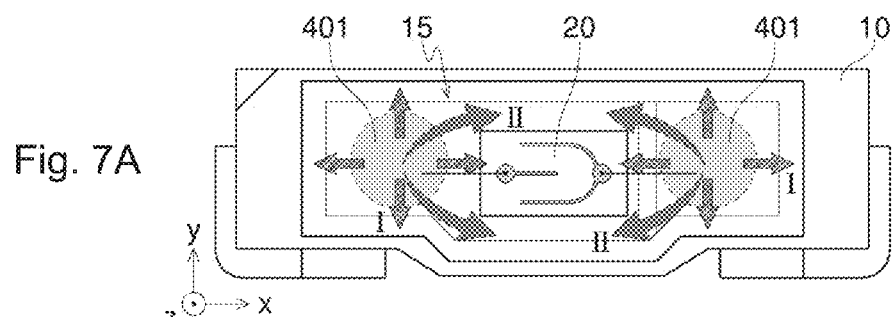
Fig. 7A
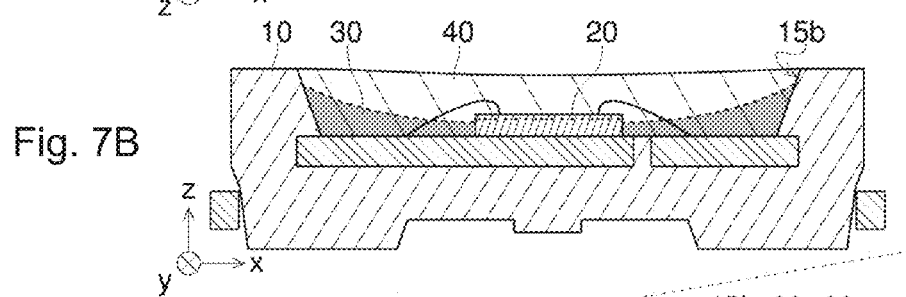
Fig. 7B
Fig. 7C 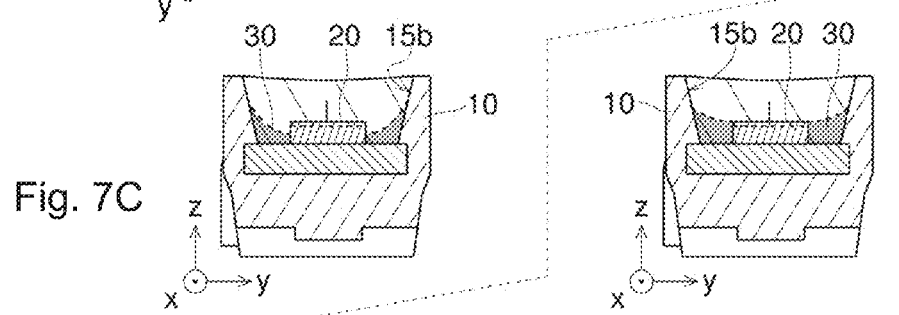 Fig. 7E

LIGHT EMITTING DEVICE AND LIGHTING DEVICE INCLUDING SAME

CROSS-REFERENCE TO RELATED APPLICATIONS

This application claims priority to and the benefit of Japanese Patent Application No. 2013-038159 filed Feb. 28, 2013, Japanese Patent Application No. 2013-137499 filed Jun. 28, 2013, and Japanese Patent Application No. 2014-013925 filed Jan. 29, 2014, the entire contents of which are incorporated herein by reference.

BACKGROUND OF THE INVENTION

1. Field of the Invention

The present disclosure relates to a light emitting device and a lighting device including the light emitting device.

2. Description of the Related Art

In recent years, light emitting devices as typified by a light emitting diode (hereinafter, sometimes referred to as an "LED") that emit white light using a combination of a light emitting element and a fluorescent body have come into use as light sources for lighting which feature low power consumption and long life and which provide alternatives to fluorescent lamps. Accordingly, there are demands for further improvements in light emitting efficiency and light distribution characteristics with less unevenness.

For example, Japanese Patent Application Laid-open No. 2006-245020 describes an LED element that includes, in a package, an LED chip, a fluorescent material which is excited by light from the LED chip and which emits light with a different wavelength from the light from the LED chip, and a translucent resin which holds the fluorescent material, wherein the LED chip has a side surface portion and a top surface portion, and the side surface portion has a slope which is inclined in a convex shape toward an opening of the package. It is also described that the fluorescent material is either not disposed on the top surface portion of the LED chip or, even if disposed on the top surface portion, a particle layer that is disposed on the top surface portion may be made thinner than a particle layer that is disposed on the side surface portion.

In addition, a light emitting device in which a fluorescent body is provided in a recessed portion of a package mounted with a light emitting element has been conventionally proposed (Japanese Patent Application Laid-open No. 2008-103688).

SUMMARY OF THE INVENTION

A light emitting device according to one embodiment of the present invention includes: a base that has an element mounting surface; a light emitting element that is mounted on the element mounting surface and that has maximum light intensity in a directly upward direction; and a coating member that contains a fluorescent body that is excited by light from the light emitting element, and that is constituted by a single layer that coats an upper part of the light emitting element, wherein the fluorescent body exists at a position other than directly above the light emitting element.

In addition, a lighting device according to another embodiment of the present invention includes the light emitting device according to one embodiment of the present invention and a light guiding member into which light from the light emitting device enters.

Furthermore, another embodiment of the present invention provides a light emitting device including a package having a recessed portion, a light emitting element mounted in the recessed portion of the package, a translucent member provided at an upper part of the light emitting element, a sealing resin that seals the recessed portion of the package, and a fluorescent body contained in the sealing resin, wherein the fluorescent body is distributed to a side of the light emitting element in a greater amount than in an upper part of the light emitting element, and a side surface of the light emitting element is exposed with respect to the sealing resin.

BRIEF DESCRIPTION OF THE DRAWINGS

FIG. 7A is a schematic top view and FIGS. 7B to 7E are schematic sectional views illustrating an example of arrangements of a fluorescent body in a light emitting device according to an embodiment;

DETAILED DESCRIPTION OF THE EMBODIMENTS

Figure 1A:
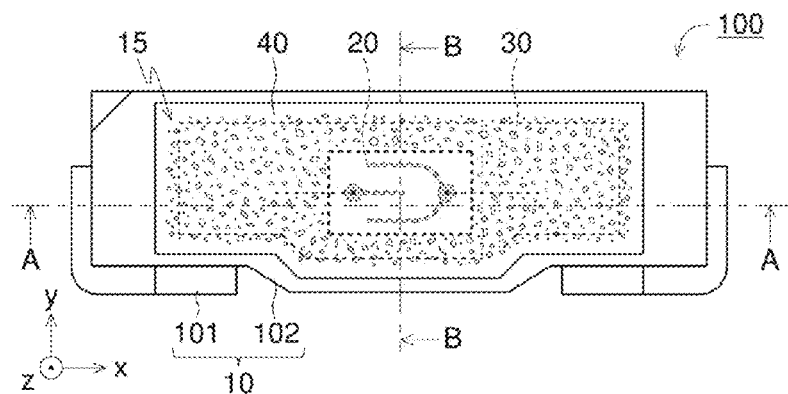
FIG. 1A is a schematic top view of a light emitting device according to an embodiment.

Hereinafter, embodiments of the invention will be described with reference to the drawings as appropriate. However, it is to be understood that the light emitting devices and the lighting devices described below are only provided to give concrete shapes to the technical concepts of the present invention and are not intended to limit the present invention to the following unless otherwise specifically noted. It is also to be understood that contents described in one embodiment or example are also applicable to other embodiments or examples. Moreover, it should be noted that sizes, positional relationships, and the like of members shown in the drawings may sometimes be exaggerated in order to facilitate understanding.

Hereinafter, it is assumed that, in the drawings, "x" direction represents a "horizontal" direction, a "y" direction represents a "vertical" direction, and a "z" direction represents an "up-down" direction or a "height (thickness)" direction. In addition, while it is assumed that the light emitting devices according to the embodiments and examples described below are arranged such that horizontal directions thereof coincide with longitudinal directions in a top view, such arrangements are not restrictive.

First Embodiment

Figure 1B:
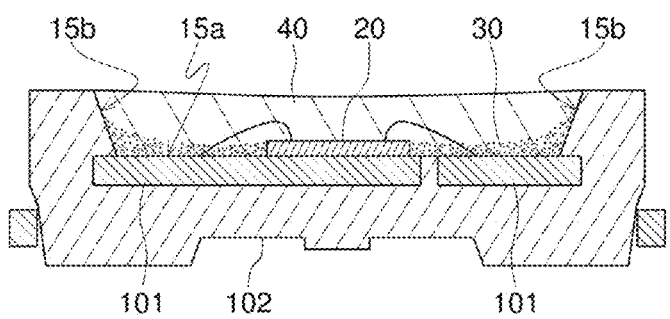
FIG. 1B is a schematic sectional view taken along a section A-A of FIG. 1A.
Figure 1C:
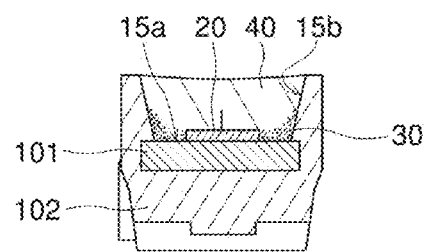
FIG. 1C is a schematic sectional view taken along a section B-B of FIG. 1A.

FIG. 1A is a schematic top view of a light emitting device according to a first embodiment, FIG. 1B is a schematic sectional view showing a section A-A in FIG. 1A, and FIG. 1C is a schematic sectional view showing a section B-B in FIG. 1A. As shown in FIG. 1, a light emitting device 100 according to the first embodiment is a side emission type (also referred to as a "side view type") light emitting diode. The light emitting device 100 includes a base 10, a light emitting element 20, and a coating member 40.

The base 10 has an element mounting surface 15a. More specifically, the base 10 is a package including a pair of positive and negative lead frames 101 and a molded body 102 that is integrally molded with the lead frames. The base 10 has a recessed portion 15. The element mounting surface 15a constitutes a bottom surface of the recessed portion 15. The bottom surface of the recessed portion 15 is constituted by a surface of the lead frames 101 and a surface of the molded body 102. A side wall surface 15b of the recessed portion is constituted by a surface of the molded body 102.

The light emitting element 20 is mounted on the element mounting surface 15a of the base. More specifically, the light emitting element 20 is a single light emitting diode chip. The light emitting element 20 is bonded to the element mounting surface 15a by an adhesive and is electrically connected to the lead frames 101 by a wire. The light emitting element 20 has maximum light intensity in a directly upward direction.

The coating member 40 coats an upper part of the light emitting element 20. More specifically, the coating member 40 is filled in the recessed portion 15 of the base and is provided up to near an opening upper surface of the recessed portion 15. An upper surface of the coating member 40 is approximately a same surface as an upper surface of the molded body 102. The coating member 40 is constituted by a single layer and an upper surface of the coating member 40 functions as a primary light emitting surface of the light emitting device 100. The coating member 40 contains a fluorescent body 30 that is excited by light from the light emitting element 20. In addition, the fluorescent body 30 exists at a position other than directly above the light emitting element 20.

The light emitting device 100 configured in this manner is capable of efficiently extracting light emitted in a directly upward direction from the light emitting element 20 to the outside of the device by suppressing light loss due to the fluorescent body 30 while obtaining wavelength converted light due to the fluorescent body 30 using light that is emitted sideways from the light emitting element 20. Hereinafter, light emitted from the light emitting element 20 may sometimes be referred to as "primary light" and wavelength converted light due to the fluorescent body 30 may sometimes be referred to as "secondary light".

Figure 2A:
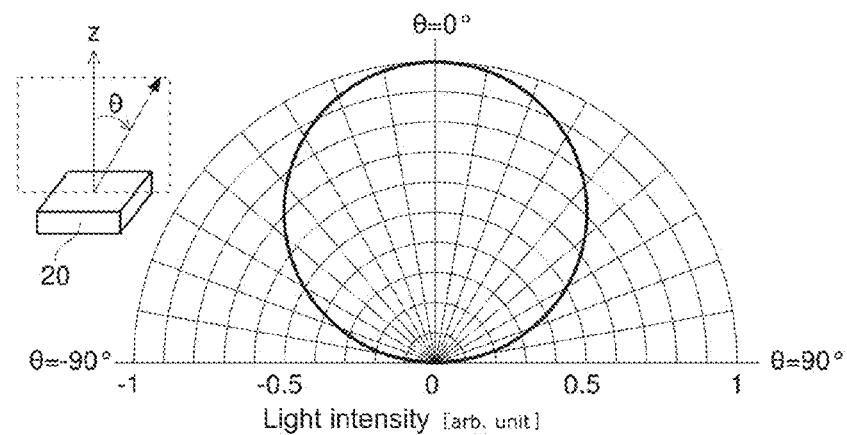
FIG. 2A is a schematic view showing an example of a light intensity distribution of a light emitting element according to an embodiment.
Figure 2B:
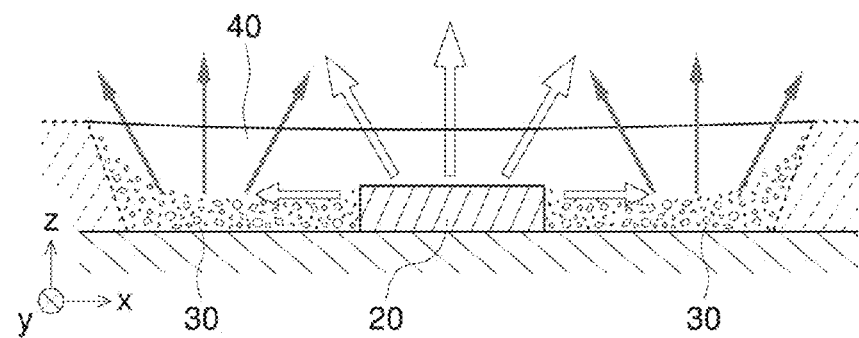
FIGS. 2B and 2C are schematic sectional views that illustrate light emission by a light emitting device according to an embodiment.
Figure 2C:
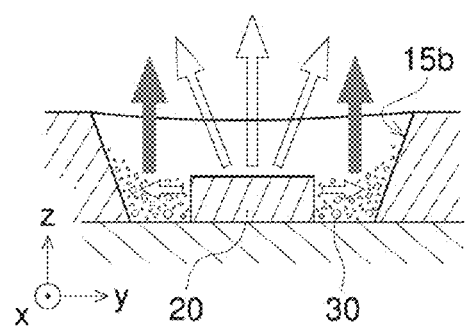

FIG. 2A is a schematic view showing an example of a light intensity distribution of a light emitting element according to the first embodiment, and FIGS. 2B and 2C are schematic sectional views that illustrate light emission by a light emitting device according to the first embodiment. As shown in FIG. 2, the light emitting element 20 emits light from a side surface in addition to an upper surface thereof. With the light emitting element 20, upward light intensity is often higher than sideways light intensity and maximum light intensity often occurs in a directly upward direction. In particular, the light emitting element 20 is likely to have such a light intensity distribution when the light emitting element 20 has a rectangular cuboid shape. Furthermore, in particular, a face-up mounted light emitting element or a light emitting element with a counter electrode structure is likely to have such a light intensity distribution. For example, the light intensity distribution may be equivalent to a lambertian distribution. In addition, the primary light emitted from the light emitting element 20 is a light that has higher directionality than the secondary light emitted from the fluorescent body 30.

Therefore, due to the fluorescent body 30 existing at a position other than directly above the light emitting element 20, a primary light component with high light intensity that is emitted upward from the light emitting element 20 can be extracted to the outside of the device in an efficient manner by suppressing light loss due to the fluorescent body 30. In addition, by directly extracting the primary light component with high light intensity to the front of (above) the device, high directionality can be maintained and optical coupling efficiency to a light guiding member (to be described later) can be enhanced. On the other hand, a primary light component that is emitted sideways from the light emitting element 20 is actively used in wavelength conversion by the fluorescent body 30. Accordingly, the primary light component emitted sideways from the light emitting element 20 is converted into secondary light and directionality of the light is reduced. As a result, light components that are absorbed by the side wall surface 15*b* or transmitted through the side wall surface 15*b* of the base are reduced. In particular, a light emitting device that is arranged to the side of the light guiding member such as a side emission type light emitting device is required to be thin. Accordingly, since a recessed portion side wall in a device lateral direction is formed relatively thin and light is likely to be transmitted through the side wall surface 15*b* and leak to the side of the device, the effectiveness of the present configuration is further enhanced. As described above, the light emitting device 100 is capable of realizing significantly high light extraction efficiency.

Moreover, a "directly upward direction" of the light emitting element 20 does not only refer to a direction that forms an angle θ of 0 degrees with a central axis (an axis which passes through a center of the upper surface of the light emitting element 20 and which is perpendicular to the upper surface of the light emitting element 20) of the light emitting element 20 and, in reality, includes directions forming an angle θ of 0 to 10 degrees with the central axis and favorably directions forming an angle θ of 0 to 5 degrees with the central axis.

Figure 3:
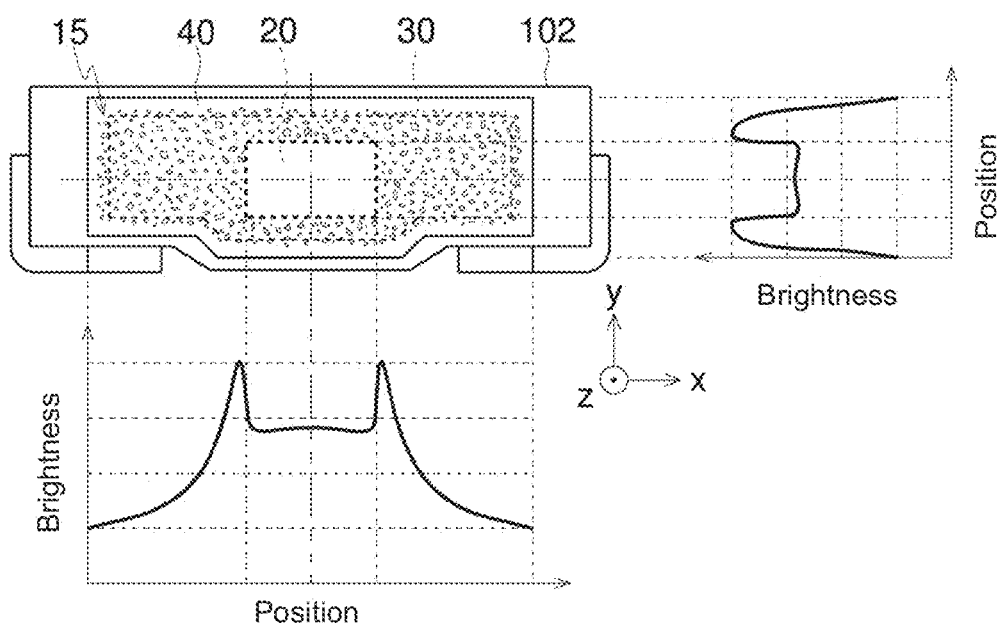
FIG. 3 is a schematic top view of a light emitting device according to an embodiment and a schematic view showing an example of a brightness distribution of the light emitting device.
Figure 4A:
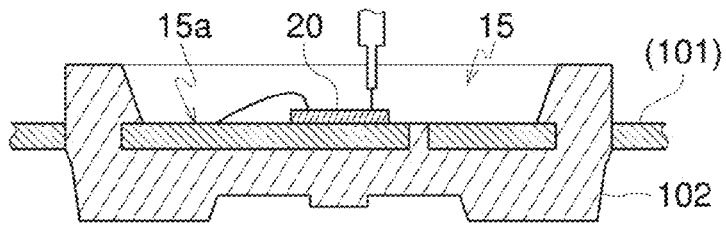
FIGS. 4A to 4E are schematic sectional views showing steps of an example of a manufacturing method of a light emitting device according to an embodiment.
Figure 4B:
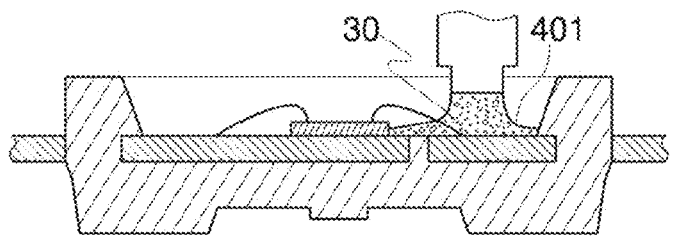
Figure 4C:
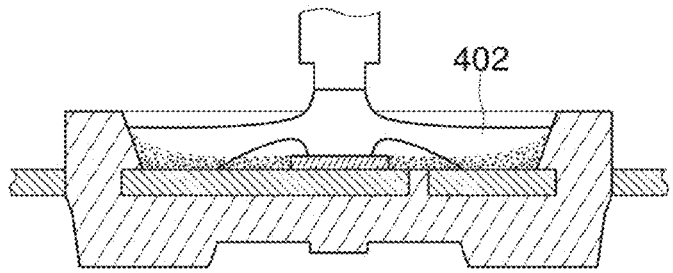
Figure 4D:
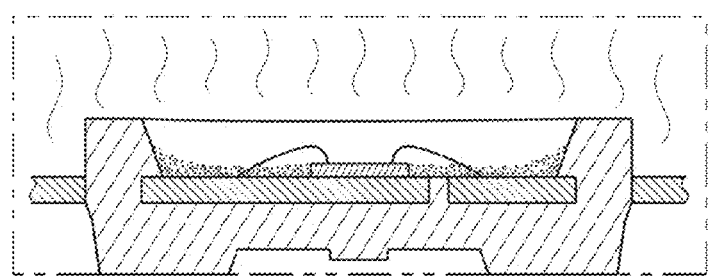
Figure 4E:
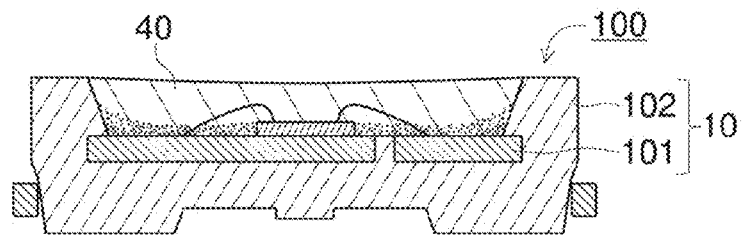

FIG. 3 is a schematic top view of a light emitting device according to the first embodiment and a schematic view showing an example of a brightness distribution of the light emitting device. The graph in FIG. 3 shows, with respect to the light emitting device 100, a distribution of brightness on a straight line (a section) which passes over the light emitting element 20 and which traverses the light emitting device 100 in a horizontal direction (x direction), and a distribution of brightness on a straight line (a section) which passes over the light emitting element 20 and which traverses the light emitting device 100 in a vertical direction (y direction). Moreover, a unit of brightness is arbitrary. As shown in FIG. 3, the brightness of the light emitting device 100 favorably reaches maximum in a vicinity of a side surface of the light emitting element 20. The reason for this is to promote the conversion by the fluorescent body 30 of primary light emitted sideways from the light emitting element 20 into secondary light at an outer edge of the light emitting element 20. More specifically, the brightness of the light emitting device 100 is low on the light emitting element 20 and higher at the outer edge of the light emitting element 20 than on the light emitting element 20. In particular, when a brightness distribution of the light emitting device is expressed in a graph such as that shown in FIG. 3, it is favorable that brightness at an outer edge of the light emitting element 20 assumes a local maximum value and respectively assumes a highest local maximum value and a second highest local maximum value at both sides of the light emitting element 20. For example, a bimodal distribution such as that shown in FIG. 3 is ideal. For example, the brightness at the outer edge of the light emitting element 20 is 1.2 times or more of the brightness on the light emitting element 20, favorably 1.4 times or more of the brightness on the light emitting element 20, and more favorably 1.5 times or more of the brightness on the light emitting element 20. Moreover, in line with the theory described above, in a chromaticity distribution of the light emitting device, high chromaticity of the primary light component is favorably observed on the light emitting element 20 and a high chromaticity of the secondary light component is observed outside of the light emitting element 20. In addition, while locations where brightness and chromaticity are measured may be at the center of the light emitting element 20 in both vertical and horizontal directions as shown in the drawing, measurements may also be taken at locations other than the center of the light emitting element 20.

FIG. 4 is a schematic sectional view showing steps (a) to (e) of an example of a manufacturing method of a light emitting device according to the first embodiment. The light emitting device 100 shown in FIG. 1 can be manufactured by performing the steps described below. Moreover, a manufacturing method of a light emitting device according to an embodiment need only at least include a step of forming a coating member on a base to which a light emitting element is mounted and the manufacturing method described below is merely an example.

In the present example, a composite base is used which is in a state where the plurality of bases 10 are connected to one another. The composite base is produced by molding a plurality of the molded bodies 102 to a plate like member constituted by a plurality of connected lead frames 101.

Step (a) shown in FIG. 4 represents a mounting step of the light emitting element 20. In step (a), the light emitting element 20 is mounted on the base. More specifically, the light emitting element 20 is fixed on the element mounting surface 15*a* of the base by an adhesive and electrically connected to the lead frames 101 (and wiring 121 to be described later). Moreover, in the present example, the light emitting element 20 is face-up mounted and connected to the lead frames 101 by a wire.

Steps (b) to (d) shown in FIG. 4 represent a forming step of the coating member 40. The coating member 40 is formed by dripping (potting) a material in a state where the material has fluidity (in a liquid form, in a sol form, or a slurry form) on the element mounting surface of the base 10 using a dispenser or the like and then solidifying the material. First, in step (b), a material 401 of the coating member including the fluorescent body 30 is dripped onto the element mounting surface 15*a* (in the present example, into the recessed portion 15) of the base. At this point, favorably, the material 401 is dripped to a position not directly above the light emitting element 20 on the element mounting surface 15*a* of the base so that the fluorescent body 30 exists at positions other than directly above the light emitting element 20 as much as possible. Moreover, a filler may be added to the material 401 to adjust viscosity and fluidity of the material 401 (the same goes for a material 402 described below). Next, in step (c), the material 402 of the coating member which substantially does not include the fluorescent body 30 is dripped onto the element mounting surface 15*a* of the base. At this point, the material 402 is favorably dripped directly above the light emitting element 20. Accordingly, if the fluorescent body 30 is present directly above the light emitting element 20, the fluorescent body 30 can be moved to the side of the light emitting element 20. In addition, after dripping the material 401, the fluorescent body 30 can be moved to the side of the light emitting element 20 by blowing a gas such as air onto the upper surface of the light emitting element 20. Finally, in step (d), the dripped materials 401 and 402 are solidified by heating or cooling.

Step (e) shown in FIG. 4 represents a dicing step of the light emitting device 100. Specifically, the plate like member of the composite base is cut and terminal portions of the lead frames 101 are formed into prescribed shapes (cutting and forming) to produce individual light emitting devices 100.

Figure 5:
FIG. 5 is a schematic top view showing a configuration of a lighting device according to an embodiment.

FIG. 5 shows a schematic top view showing a configuration of a lighting device according to the first embodiment. As shown in FIG. 5, a lighting device 300 includes the light emitting device 100 and a light guiding member 200 into which light from the light emitting device 100 enters. The light guiding member 200 has a plate shape. A plurality of the light emitting devices 100 are arranged side by side so as to oppose one side surface of the light guiding member 200. Moreover, each of the light emitting devices 100 is mounted on a single circuit board so as to be energizable.

When light enters one side surface of the light guiding member 200 from the light emitting device 100, the light guiding member 200 guides the light in a planar direction and emits the light from one main surface (upper surface). At this point, primary light emitted from the light emitting element 20 and secondary light emitted from the fluorescent body 30 is mixed in the light guiding member 200. Accordingly, brightness spots and uneven coloring (uneven light emission chromaticity) in each light emitting device 100 can be reduced. Therefore, by combining the light emitting device 100 described above with the light guiding member 200, a lighting device can be obtained which is capable of emitting light with reduced uneven coloring and with high light emitting efficiency. Moreover, a light reflecting member may be provided on a lower surface and a side surface other than the side surface that is the light entering surface of the light guiding member 200 or a light diffusing member may be provided on the upper surface of the light guiding member 200.

Hereinafter, a favorable mode of the light emitting device 100 according to the first embodiment will be described.

As shown in FIG. 1, the fluorescent body 30 favorably exists in a large amount on the side of the element mounting surface 15a among the coating member 40. Accordingly, even primary light emitted obliquely upward from the light emitting element 20 can be extracted more efficiently while suppressing light loss due to the fluorescent body 30. In addition, primary light emitted sideways from the light emitting element 20 can be used more efficiently for wavelength conversion by the fluorescent body 30. Moreover, such an arrangement mode of the fluorescent body 30 can be obtained by precipitating the fluorescent body 30 on the side of the element mounting surface 15a.

As shown in FIG. 1, the fluorescent body 30 favorably exists so as to coat the side surface of the light emitting element 20. Accordingly, conversion of the primary light emitted sideways from the light emitting element 20 into secondary light by the fluorescent body 30 can be promoted to enhance light extraction efficiency by preventing the primary light emitted sideways from the light emitting element 20 from being absorbed by the side wall surface 15b of the base or from passing through the side wall surface 15b. In particular, the fluorescent body 30 more favorably exists so as to coat a side surface of an active layer of the light emitting element 20. The expression "the fluorescent body 30 coats the side surface of the light emitting element 20" as used herein not only includes a state where the fluorescent body 30 is deposited so as to be in contact with the side surface of the light emitting element 20 but also includes a state where the fluorescent body 30 is deposited in the vicinity of the side surface of the light emitting element 20.

As shown in FIG. 1, the base 10 has side wall surfaces 15b that sandwich the light emitting element 20. In addition, the fluorescent body 30 exists from above the element mounting surface 15a to above the side wall surfaces 15b. Accordingly, light extraction efficiency can easily be enhanced by preventing the primary light emitted sideways from the light emitting element 20 from being absorbed by the side wall surface 15b of the base or from passing through the side wall surface 15b. In addition, conversion of the primary light emitted sideways from the light emitting element 20 into secondary light by the fluorescent body 30 can be further promoted. In particular, the fluorescent body 30 above the side wall surface 15b more favorably reaches a higher position than the upper surface of the light emitting element 20. Moreover, while the side wall surfaces 15b are provided so as to enclose a periphery (circumference) of the light emitting element 20 because the light emitting element 20 is housed in the recessed portion 15 in the present example, the side wall surfaces 15b need only be provided so as to at least sandwich the light emitting element 20 from two directions as in the case of a third embodiment (to be described later). Moreover, while the side wall surfaces 15b are inclined in the present example, the side wall surfaces 15b may also be curved.

While the fluorescent body 30 need only exist in at least a part of an area that is coated by the coating member 40 on the element mounting surface 15a, as shown in FIG. 1, the fluorescent body 30 favorably exists across an approximately entire area which is not directly above the light emitting element 20 and which is coated by the coating member 40 on the element mounting surface 15a. Accordingly, conversion of the primary light emitted sideways from the light emitting element 20 into secondary light by the fluorescent body 30 can be promoted to more easily enhance light extraction efficiency by more easily preventing the primary light emitted sideways from the light emitting element 20 from being absorbed by the side wall surface 15b of the base or from passing through the side wall surface 15b.

Figure 6A:
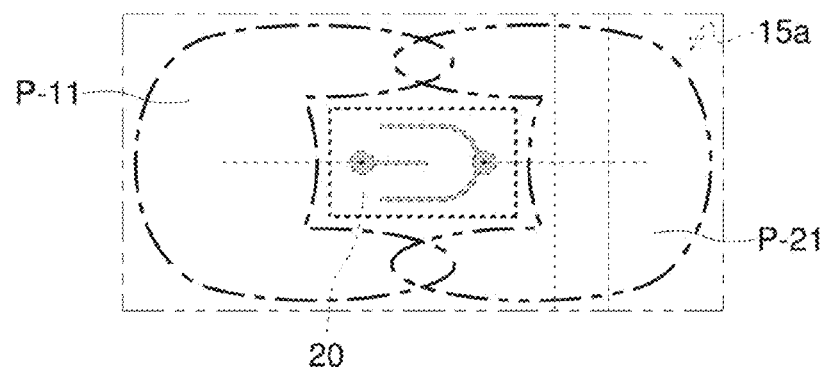
FIGS. 6A to 6C are schematic top views illustrating an example of arrangements of a fluorescent body in a light emitting device according to an embodiment.
Figure 6B:
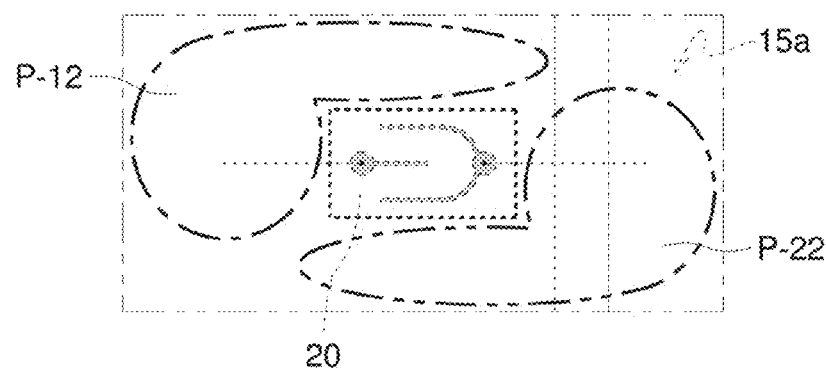
Figure 6C:
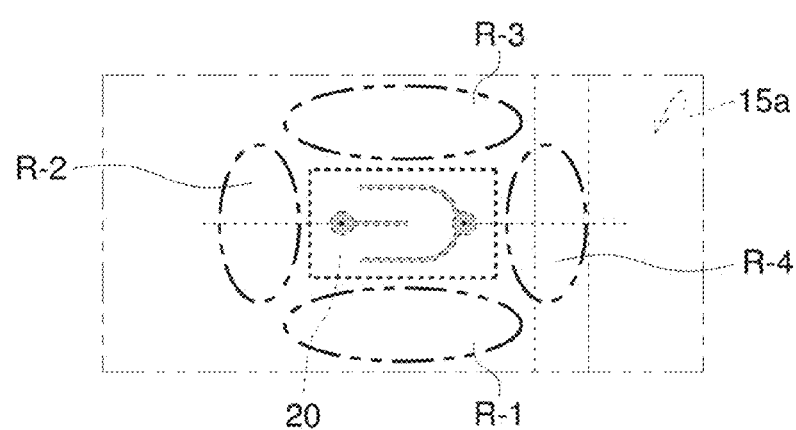

FIGS. 6A, 6B, and 6C are schematic top views illustrating an example of arrangements of a fluorescent body in a light emitting device according to the first embodiment. In the light emitting device 100, the fluorescent body 30 may be constituted by one type of a fluorescent body or may include a first fluorescent body and a second fluorescent body of a different type from the first fluorescent body. For example, when the fluorescent body 30 is constituted by two types of fluorescent bodies in order to provide light emission with a high color rendering property, a first fluorescent body favorably exists in a large amount in a first area and a second fluorescent body favorably exists in a large amount in a second area that differs from the first area in a top view of the element mounting surface 15a. Accordingly, light extraction efficiency can be easily enhanced by reducing the effects of absorption and scattering of secondary light emitted from the first fluorescent body by the second fluorescent body.

In particular, favorably, a top view shape of the light emitting element 20 is a rectangular shape, the first area is an area opposing a first side surface of the light emitting element 20, and a second area is an area opposing a second side surface of the light emitting element 20 which is on an opposite side to the first side surface. Accordingly, a main portion of the first area and a main portion of the second area can easily be provided so as to be separated from one another and secondary light respectively emitted from the first fluorescent body and the second fluorescent body can easily be extracted to the outside of the device in an efficient manner.

For example, in the example shown in FIG. 6A, a first area P-11 and a second area P-21 are respectively provided in C-shapes (U-shapes) that sandwich the light emitting element 20 in a horizontal direction on the element mounting surface 15a. Moreover, a part of the first area P-11 and a part of the second area P-21 may overlap one another near a center of an outer circumference of the light emitting element 20. Such an arrangement mode of the fluorescent body can easily be obtained by dripping the material (401) of the coating member including the fluorescent body to an area positioned directly to the side of the light emitting element 20 (in other words, an area opposing one side surface of the light emitting element 20) on the element mounting surface 15a. In this mode, the fluorescent body may easily be arranged in the vicinity of the light emitting element 20.

In addition, for example, in the example shown in FIG. 6B, a first area P-12 and a second area P-22 are respectively provided in L-shapes so as to oppose two consecutive side surfaces of the light emitting element 20 on the element mounting surface 15a. Such an arrangement mode of the fluorescent body can easily be obtained by dripping the material (401) of the coating member including the fluorescent body to an area near a corner on the element mounting surface 15a or to an area positioned obliquely (on an extension line of a diagonal line) with respect to the light emitting element 20 on the element mounting surface 15a. In this mode, the first area and the second area may easily be provided separated from one another.

Moreover, favorably, the first fluorescent body and the second fluorescent body have different emission colors. For example, the emission color of the first fluorescent body may be green (with an emission peak wavelength of 500 nm or more and less than 565 nm) or yellow (with an emission peak wavelength of 565 nm or more and 590 nm or less) and the emission color of the second fluorescent body is red (with an emission peak wavelength of 610 nm or more and 750 nm or less). An increased difference between the emission wavelengths of the first fluorescent body and the second fluorescent body enables secondary light that is emitted from one of the fluorescent bodies to be easily absorbed by the other fluorescent body. Therefore, an arrangement mode of the fluorescent bodies such as that described above becomes more effective.

Furthermore, for example, in order to prevent light from leaking from a recessed portion side wall in the device lateral direction which is likely to be formed relatively thin as described earlier, as shown in FIG. 6C, the fluorescent body may be arranged so as to exist in areas R-1 to R-4 in a vicinity of the light emitting element 20 on the element mounting surface 15a (while at least one area among R-1 to R-4 may suffice, a ring-like area in which all of the areas are connected may be used instead) in a larger amount than in other areas on the element mounting surface 15a. In addition, the fluorescent body may be arranged so as to exist in areas R-1 and R-3 that are sandwiched between the side wall surface 15b facing the vertical direction (for example, the device lateral direction) and a side surface of the light emitting element 20 opposing the side wall surface 15b in a larger amount than in areas R-2 and R-4 that are sandwiched between the side wall surface 15b facing the horizontal direction (for example, the device longitudinal direction) and a side surface of the light emitting element 20 opposing the side wall surface 15b. Furthermore, the fluorescent body may be arranged so as to exist in one of the two areas R-1 and R-3 that are sandwiched between the side wall surface 15b facing the vertical direction (for example, the device lateral direction) and a side surface of the light emitting element 20 opposing the side wall surface 15b (in the case of a side emission type light emitting device, favorably, the area on the side of the device mounting surface (for example, R-1)) in a larger amount than in the other area. Moreover, such arrangements of the fluorescent body can be realized by performing dripping of the materials 401 and 402 of the coating member described earlier in a plurality of stages, adjusting a content of the fluorescent body in the material 401, adjusting dripping positions of the materials 401 and 402, or the like or by combining these methods as appropriate.

Figure 7D:
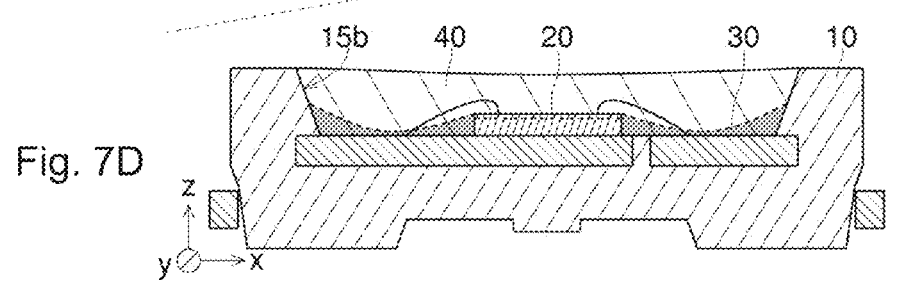

FIGS. 7A and 7B to 7E are, respectively, a schematic top view and schematic sectional views illustrating an example of an arrangement of a fluorescent body in a light emitting device according to the first embodiment. As shown in FIG. 1 and the like, with a side emission type light emitting device, the recessed portion 15 of the base 10 is long in the horizontal direction and short in the vertical direction. Therefore, in most cases, a distance between the light emitting element 20 mounted on the element mounting surface 15a and the side wall surface 15b of the recessed portion is shorter in the vertical direction than in the horizontal direction. In other words, the two areas sandwiched between the side wall surface 15b facing the horizontal direction and a side surface of the light emitting element 20 opposing the side wall surface 15b form a relatively large space. In comparison, the two areas sandwiched between the side wall surface 15b facing the vertical direction and a side surface of the light emitting element 20 opposing the side wall surface 15b form a relatively small space. In addition, the side wall surface 15b facing the vertical direction is inclined more steeply (forms a smaller angle with the bottom surface of the recessed portion) than the side wall surface 15b facing the horizontal direction. Now, as shown in FIG. 7A, let us consider dripping the material 401 of the coating member including the fluorescent body in an area sandwiched between the side wall surface 15b facing the horizontal direction and a side surface of the light emitting element 20 opposing the side wall surface 15b. At this point, a flow of the material 401 of the coating member includes a part that attempts to creep up the side wall surface 15b or a side surface of the light emitting element 20 (denoted by "I" in the drawing) and a part that attempts to penetrate into an area sandwiched between the side wall surface 15b facing the vertical direction and a side surface of the light emitting element 20 opposing the side wall surface 15b (denoted by "II" in the drawing).

For example, when using an air-powered dispenser, the flow of (I) can be promoted and, as a result, an arrangement of the fluorescent body 30 such as those shown in FIGS. 7B and 7C can be readily obtained. More specifically, a deposited layer of the fluorescent body 30 tends to be thinner in an area sandwiched between the side wall surface 15b facing the vertical direction and a side surface of the light emitting element 20 opposing the side wall surface 15b than in an area sandwiched between the side wall surface 15b facing the horizontal direction and a side surface of the light emitting element 20 opposing the side wall surface 15b. In addition, for example, in an area sandwiched between an outer edge of the light emitting element 20 and particularly the side wall surface 15b facing the vertical direction and a side surface of the light emitting element 20 opposing the side wall surface 15b, the deposited layer of the fluorescent body 30 is likely to be formed in a thickness reaching a midway height of the side surface of the light emitting element 20 (which is favorably lower than a height of the active layer) without coating the active layer. On the other hand, the deposited layer of the fluorescent body 30 above the side wall surface 15b is likely to reach a position that is higher than the upper surface of the light emitting element 20 due to the promotion of creeping.

Meanwhile, when using a jet-powered dispenser, the flow of (II) can be promoted and, as a result, an arrangement of the fluorescent body 30 such as those shown in FIGS. 7D and 7E can be readily obtained. This mode is capable of realizing the arrangement of the fluorescent body 30 shown in FIG. 6C described earlier. More, specifically, the deposited layer of the fluorescent body 30 is likely to be thinnest in an area sandwiched between the side wall surface 15b facing the horizontal direction and a side surface of the light emitting element 20 opposing the side wall surface 15b and, in particular, at a dripping position (for example, at center of the area) of the material 401 of the coating member. Therefore, the deposited layer of the fluorescent body 30 is likely to be formed in a recessed shape between the side wall surface 15b facing the horizontal direction and a side surface of the light emitting element 20 opposing the side wall surface 15b. In addition, a deposited layer of the fluorescent body 30 tends to be thicker in an area sandwiched between the side wall surface 15b facing the vertical direction and a side surface of the light emitting element 20 opposing the side wall surface 15b than in an area sandwiched between the side wall surface 15b facing the horizontal direction and a side surface of the light emitting element 20 opposing the side wall surface 15b (or at least a thinnest part on the area). Furthermore, in an outer edge of the light emitting element 20, particularly in an area sandwiched between the side wall surface 15b facing the vertical direction and a side surface of the light emitting element 20 opposing the side wall surface 15b, the deposited layer of the fluorescent body 30 favorably coats the side surface of the light emitting element 20 up to a height in a vicinity of the upper surface (favorably, the active layer). On the other hand, while the deposited layer of the fluorescent body 30 above the side wall surface 15b favorably reaches a position higher than the upper surface of the light emitting element 20, the deposited layer tends to be lower (thinner) as compared to the examples shown in FIGS. 7B and 7C described above.

Second Embodiment

Figure 8A:
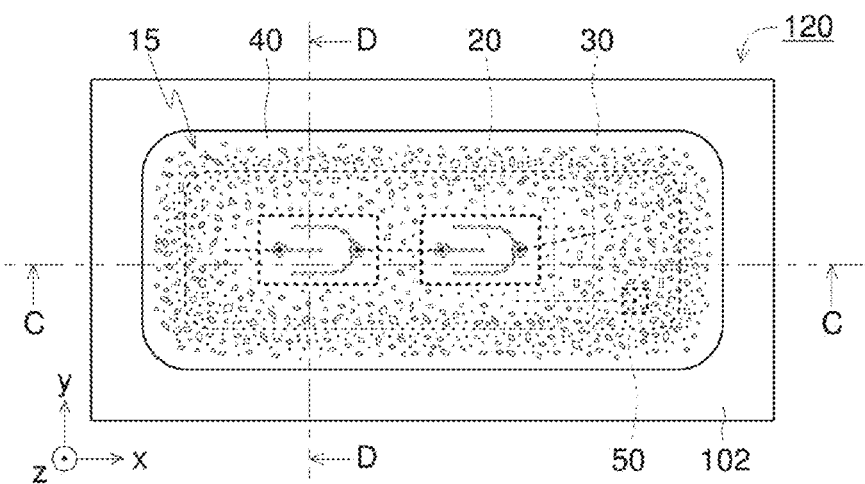
FIG. 8A is a schematic top view of a light emitting device according to an embodiment.
Figure 8B:
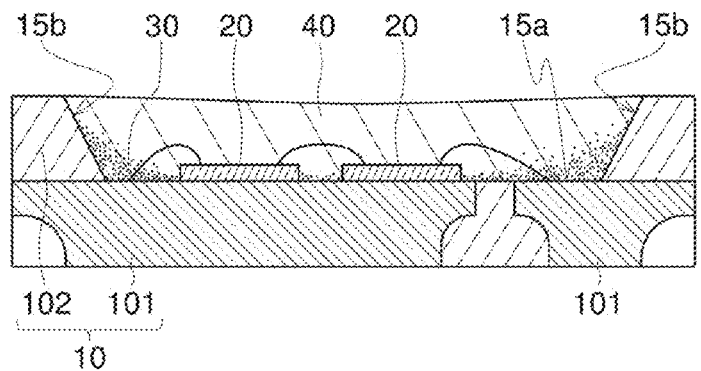
FIG. 8B is a schematic sectional view taken along a section C-C of FIG. 8A.
Figure 8C:
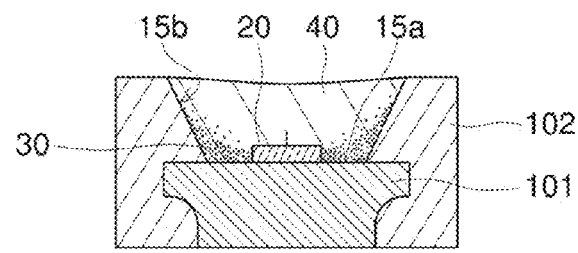
FIG. 8C is a schematic sectional view taken along a section D-D of FIG. 8A.

FIG. 8A is a schematic top view of a light emitting device according to a second embodiment, FIG. 8B is a schematic sectional view showing a section C-C in FIG. 8A, and FIG. 8C is a schematic sectional view showing a section D-D in FIG. 8A. As shown in FIG. 8, a light emitting device 120 according to the second embodiment is a top emission type (also referred to as a "top view type") light emitting diode. The light emitting device 120 includes a base 10, a light emitting element 20, and a coating member 40.

The base 10 has an element mounting surface 15a. More specifically, the base 10 is a package including a pair of positive and negative lead frames 101 and a molded body 102 that is integrally molded with the lead frames. The lead frames 101 are small plate-like pieces and are not bent like the light emitting device 100 according to the first embodiment. In addition, at least a part of a lower surface (back surface) of the lead frames 101 is exposed to the outside of the device and constitutes a terminal portion for external connection. The base 10 has a recessed portion 15. The element mounting surface 15a constitutes a bottom surface of the recessed portion 15. The bottom surface of the recessed portion 15 is constituted by a surface of the lead frames 101 and a surface of the molded body 102. A side wall surface 15b of the recessed portion is constituted by a surface of the molded body 102.

The light emitting element 20 is mounted on the element mounting surface 15a of the base. More specifically, the light emitting element 20 is a plurality of (in the present example, two) light emitting diode chips. Each of the light emitting elements 20 is bonded to the element mounting surface 15a by an adhesive and is electrically connected to the lead frames 101 by a wire. Moreover, the plurality of light emitting elements 20 are connected in series to one another by a wire. Each of the light emitting elements 20 has maximum light intensity in a directly upward direction.

The coating member 40 coats upper parts of all of the light emitting elements 20. More specifically, the coating member 40 is filled in the recessed portion 15 of the base and is provided up to near an opening upper surface of the recessed portion 15. An upper surface of the coating member 40 is approximately a same surface as an upper surface of the molded body 102. The coating member 40 is constituted by a single layer and an upper surface of the coating member 40 functions as a primary light emitting surface of the light emitting device 120. The coating member 40 contains a fluorescent body 30 that is excited by light from the light emitting elements 20. In addition, the fluorescent body 30 exists at a position other than directly above the respective light emitting elements 20.

Even with such a light emitting device 120, significantly high light extraction efficiency can be realized while producing wavelength converted light by the fluorescent body 30.

As shown in FIG. 8, favorably, the fluorescent body 30 also exists in an area between respective light emitting elements 20 on the element mounting surface 15a. Accordingly, light extraction efficiency can be enhanced by promoting the conversion of primary light emitted from a light emitting element 20 towards an adjacent light emitting element 20 into secondary light by the fluorescent body 30 and suppressing absorption of the primary light by the adjacent light emitting element 20. In addition, a secondary light component can be compensated in the vicinity of the light emitting element 20 and unevenness in light emission chromaticity can be reduced.

Furthermore, as shown in FIG. 8, the light emitting device 120 includes a protective element 50. The protective element 50 is mounted to a lead frame that differs from the lead frame on which the light emitting elements 20 are mounted among the pair of lead frames 101. Accordingly, a distance between the light emitting element 20 and the protective element 50 can be increased so that loss due to absorption by the protective element 50 of the primary light emitted from the light emitting elements 20 is easily suppressed. In addition, the fluorescent body 30 favorably exists between the light emitting element 20 and the protective element 50. Accordingly, by converting primary light emitted sideways from the light emitting elements 20 into secondary light or reflecting (scattering) the primary light upward by the fluorescent body 30 before the primary light reaches the protective element 50, light loss due to absorption by the protective element 50 can be suppressed and light extraction efficiency can be easily enhanced. Furthermore, more favorably, the fluorescent body 30 existing from above the element mounting surface 15a to above the side wall surface 15b also coats an upper part of the protective element 50.

Third Embodiment

Figure 9A:
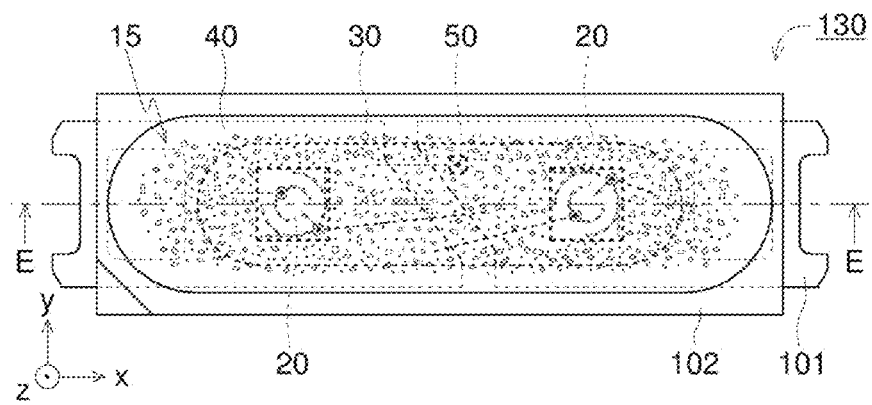
FIG. 9A is a schematic top view of a light emitting device according to an embodiment.
Figure 9B:
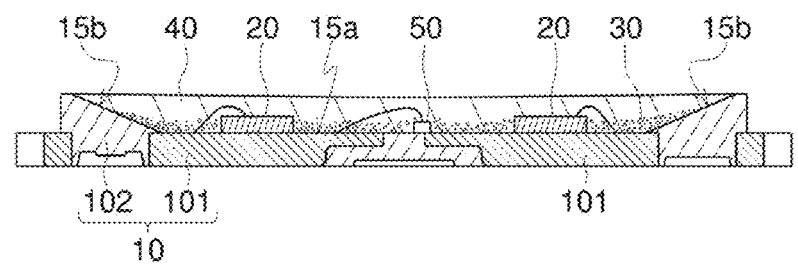
FIG. 9B is a schematic sectional view taken along a section E-E of FIG. 9A.
Figure 9C:
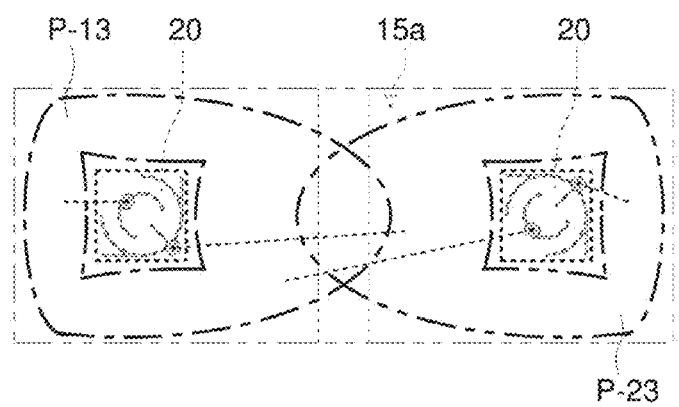
FIG. 9C is a schematic top view illustrating an example of an arrangement of a fluorescent body in the light emitting device.

FIG. 9A is a schematic top view of a light emitting device according to a third embodiment, and FIG. 9B is a schematic sectional view showing a section E-E in FIG. 9A. In addition, FIG. 9C is a schematic top view illustrating an example of an arrangement of a fluorescent body in a light emitting device according to the third embodiment. As shown in FIGS. 9A and 9B, a light emitting device 130 according to the third embodiment is a top emission type light emitting diode. The light emitting device 130 includes a base 10, a light emitting element 20, and a coating member 40.

The base 10 has an element mounting surface 15a. More specifically, the base 10 is a package including a pair of positive and negative lead frames 101 and a molded body 102 that is integrally molded with the lead frames. The lead frames 101 are small plate-like pieces and are not bent like the light emitting device 100 according to the first embodiment. In addition, at least a part of the lower surface (back surface) of the lead frames 101 is exposed to the outside of the device and constitutes a terminal portion for external connection. The base 10 has a recessed portion 15. The element mounting surface 15a constitutes a bottom surface of the recessed portion 15. The bottom surface of the recessed portion 15 is constituted by a surface of the lead frames 101 and a surface of the molded body 102. A side wall surface 15b of the recessed portion is constituted by a surface of the molded body 102.

The light emitting element 20 is mounted in plurality on the element mounting surface 15a of the base. More specifically, the light emitting element 20 is two light emitting diode chips. Each of the light emitting elements 20 is bonded to the element mounting surface 15a by an adhesive and is electrically connected to the lead frames 101 by a wire. In particular, in the present example, one each of the light emitting elements 20 is mounted to a positive electrode side and a negative electrode side of the lead frames 101. In addition, the light emitting elements 20 are connected in parallel with one another by a wire. Furthermore, each of the light emitting elements 20 has maximum light intensity in a directly upward direction.

The coating member 40 coats upper parts of all of the light emitting elements 20. More specifically, the coating member 40 is filled in the recessed portion 15 of the base and is provided up to near an opening upper surface of the recessed portion 15. An upper surface of the coating member 40 is approximately a same surface as an upper surface of the molded body 102. The coating member 40 is constituted by a single layer and an upper surface of the coating member 40 functions as a primary light emitting surface of the light emitting device 130. The coating member 40 contains a fluorescent body 30 that is excited by light from the light emitting element 20. In addition, the fluorescent body 30 exists at a position other than directly above the respective light emitting elements 20.

Even with such a light emitting device 130, significantly high light extraction efficiency can be realized while producing wavelength converted light by the fluorescent body 30.

In addition, as shown in FIGS. 9A and 9B, by mounting one each of the light emitting elements 20 to the positive electrode side and the negative electrode side of the lead frames 101, a separation distance between the light emitting elements 20 can be easily increased and brightness of the light emitting device can be easily adjusted. Furthermore, by arranging the protective element 50 between the light emitting elements 20 and particularly at approximately center of the base 10, light loss due to absorption by the protective element 50 can be easily suppressed and light extraction efficiency can be easily enhanced.

In addition, as shown in FIG. 9C, on the element mounting surface 15a, a first area P-13 in which a first fluorescent body exists in a large amount is provided so as to enclose a periphery of a first light emitting element 20 and a second area P-23 in which a second fluorescent body of a different type from the first fluorescent body exists in a large amount is provided so as to enclose a periphery of a second light emitting element 20 that differs from the first light emitting element. As in the present example, when the base 10 is elongated in the horizontal direction and light emitting elements 20 are respectively mounted to the positive electrode side and the negative electrode side of the lead frames 101, a relatively large space is more easily secured around each light emitting element 20. As a result, a main portion of the first area and a main portion of the second area can easily be provided so as to be separated from one another and secondary light respectively emitted from the first fluorescent body and the second fluorescent body can easily be extracted to the outside of the device in an efficient manner. Moreover, a part of the first area P-13 and a part of the second area P-23 may overlap one another between the light emitting elements 20. In addition, a mode similar to that described earlier can be applied with respect to emission colors of the first fluorescent body and the second fluorescent body.

Fourth Embodiment

Figure 10A:
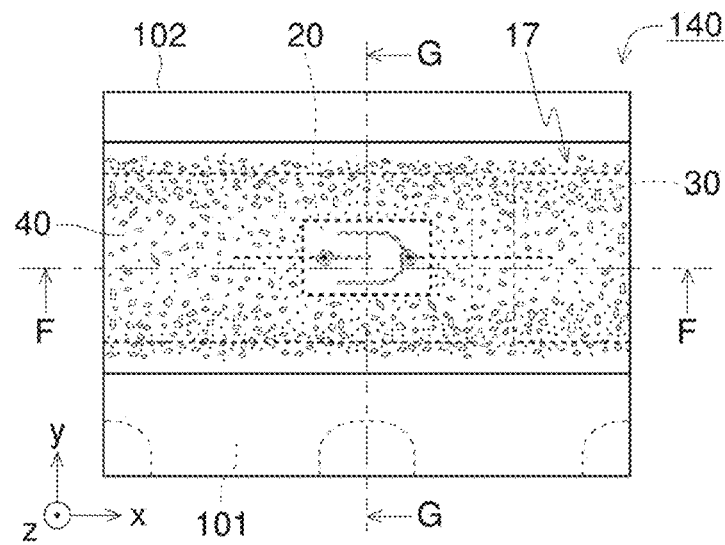
FIG. 10A is a schematic top view of a light emitting device according to an embodiment.
Figure 10B:
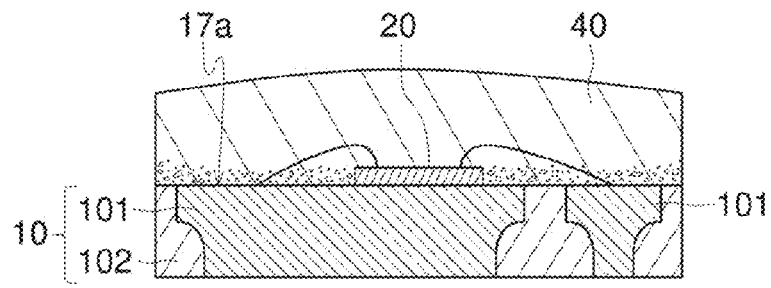
FIG. 10B is a schematic sectional view taken along a section F-F of FIG. 10A.
Figure 10C:
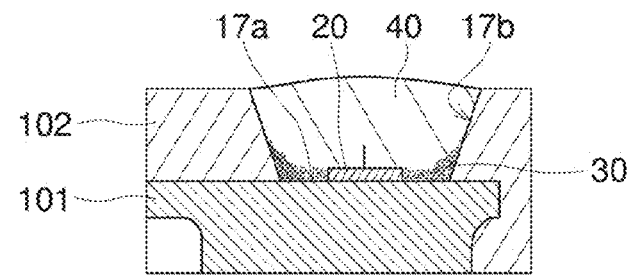
FIG. 10C is a schematic sectional view taken along a section G-G of FIG. 10A.

FIG. 10A is a schematic top view of a light emitting device according to a fourth embodiment, FIG. 10B is a schematic sectional view showing a section F-F in FIG. 10A, and FIG. 10C is a schematic sectional view showing a section G-G in FIG. 10A. As shown in FIG. 10, a light emitting device 140 according to the fourth embodiment is a side emission type light emitting diode. The light emitting device 140 includes a base 10, a light emitting element 20, and a coating member 40.

The base 10 has an element mounting surface 17a. More specifically, the base 10 is a package including a pair of positive and negative lead frames 101 and a molded body 102 that is integrally molded with the lead frames. The lead frames 101 are small plate-like pieces and are not bent like the light emitting device 100 according to the first embodiment. In addition, at least a part of the lower surface (back surface) of the lead frames 101 is exposed to the outside of the device and constitutes a terminal portion for external connection. The base 10 has a recessed portion 17. The element mounting surface 17a constitutes a bottom surface of the recessed portion 17. The bottom surface of the recessed portion 17 is constituted by a surface of the lead frames 101 and a surface of the molded body 102. A side wall surface 17b of the recessed portion is constituted by a surface of the molded body 102.

The light emitting element 20 is mounted on the element mounting surface 17a of the base. More specifically, the light emitting element 20 is a single light emitting diode chip. The light emitting element 20 is bonded to the element mounting surface 17a by an adhesive and is electrically connected to the lead frames 101 by a wire. The light emitting element 20 has maximum light intensity in a directly upward direction.

The coating member 40 coats an upper part of the light emitting element 20. More specifically, the coating member 40 is constituted by a single layer. The coating member 40 is at least filled to an upper surface of an opening of the recessed portion 17 of the base. An upper surface of the coating member 40 is a curved surface protruding further than an upper surface of the molded body 102 and is capable of enhancing light extraction efficiency more easily than a coating member 40 with a flat upper surface. The coating member 40 contains a fluorescent body 30 that is excited by light from the light emitting element 20. In addition, the fluorescent body 30 exists at a position other than directly above the light emitting element 20.

Even with such a light emitting device 140, significantly high light extraction efficiency can be realized while producing wavelength converted light by the fluorescent body 30.

As shown in FIG. 10, the recessed portion 17 is opened in a horizontal direction and the side wall surface 17b is constituted by two surfaces that sandwich the light emitting element 20 in a vertical direction. In other words, the coating member 40 has an upper surface and two side surfaces that are exposed to the outside of the device. Accordingly, there is a fewer number of members that block light emitted from the light emitting element 20 and the fluorescent body 30 in the horizontal direction in which the recessed portion 17 is opened, and light can be extracted to the outside of the device in an efficient manner. Moreover, the side surfaces of the coating member 40 that are exposed to the outside of the device are approximately the same surfaces as the side surfaces of the base 10. Such a mode can be produced by cutting the coating member 40 for a plurality of light emitting devices that are consecutively formed on the composite base together with the base 10 (composite base).

Fifth Embodiment

Figure 11A:
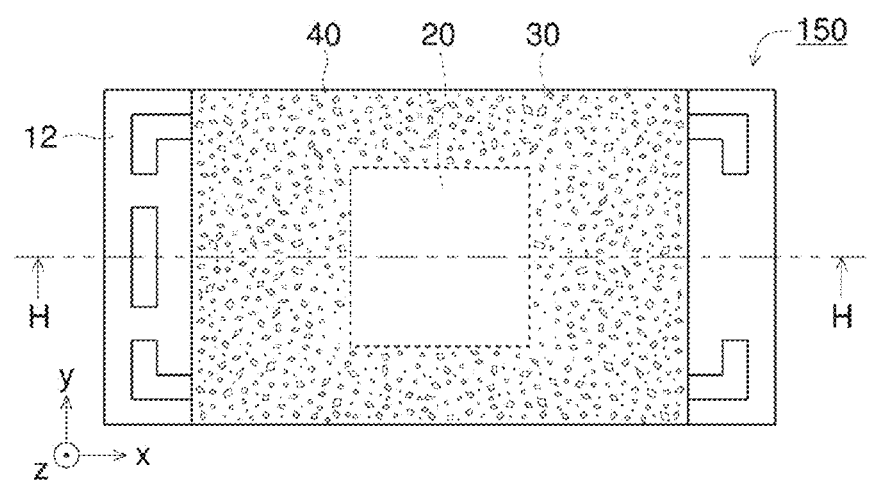
FIG. 11A is a schematic top view of a light emitting device according to an embodiment and FIG. 11B is a schematic sectional view taken along a section H-H of FIG. 11A.
Figure 11B:
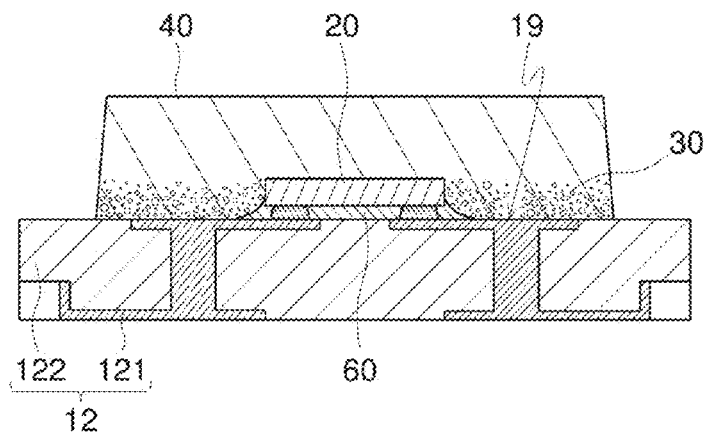

FIG. 11A is a schematic top view of a light emitting device according to a fifth embodiment, and FIG. 11B is a schematic sectional view showing a section H-H in FIG. 11A. As shown in FIG. 11, a light emitting device 150 according to the fifth embodiment is a top emission type light emitting diode. The light emitting device 150 includes a base 12, a light emitting element 20, and a coating member 40.

The base 12 has an element mounting surface 19. More specifically, the base 12 is a wiring substrate including a pair of positive and negative wirings 121 and a substrate 122 that holds the wirings. The base 12 has a flat plate shape. The element mounting surface 19 is constituted by an upper surface of the base 12.

The light emitting element 20 is mounted on the element mounting surface 19 of the base. More specifically, the light emitting element 20 is a single light emitting diode chip. The light emitting element 20 is flip-chip mounted on the base 12. In other words, the light emitting element 20 is electrically connected to the wirings 121 by a conductive adhesive. The light emitting element 20 has maximum light intensity in a directly upward direction.

The coating member 40 coats an upper part of the light emitting element 20. More specifically, the coating member 40 is constituted by a single layer. The coating member 40 contains a fluorescent body 30 that is excited by light from the light emitting element 20. The fluorescent body 30 exists at a position other than directly above the light emitting element 20. The coating member 40 is formed in an approximately rectangular cuboid shape above the base 12. Therefore, an upper surface and all side surfaces of the coating member 40 are exposed to the outside. Accordingly, there is a fewer number of members that block light emitted from the light emitting element 20 and the fluorescent body 30 in all directions above the device and light can be extracted to the outside of the device in an efficient manner. In addition, light can be emitted across a wide range above the device and a wide light distribution can be realized. Furthermore, one of the two pairs of side surfaces of the coating member 40 which face each other is approximately the same surfaces as the side surfaces of the base 12. Such a mode can be produced by installing a detachable frame on a composite base and cutting the coating member 40 for a plurality of light emitting devices consecutively formed inside the frame on the composite base together with the base 12 (composite base). In addition, a surface of the coating member 40 may be a curved surface in order to enhance light extraction efficiency. Examples of shapes of the surface of the coating member 40 include a shape created by cutting out a part of a cylinder such as a semi-cylindrical shape.

Even with such a light emitting device 150, significantly high light extraction efficiency can be realized while producing wavelength converted light by the fluorescent body 30.

As shown in FIG. 11, an underfill 60 is provided between the element mounting surface 19 of the base and the light emitting element 20. The underfill 60 is favorably constituted by a light reflective material. Accordingly, light extraction efficiency can be enhanced by reflecting primary light that is emitted from the light emitting element 20 upward and suppressing light loss due to the base 12. In particular, while the underfill 60 may coat the side surface of the light emitting element 20, the underfill 60 is favorably provided so as to expose at least a part of the side surface of the light emitting element 20 (in other words, so that the coating member 40 coats at least a part of the side surface of the light emitting element 20) in order to obtain secondary light created by the fluorescent body 30 that exists to the side of the light emitting element 20.

Hereinafter, respective components of the light emitting devices and the lighting devices according to the embodiments will be described.

(Bases 10 and 12)

The base is a member that acts as a pedestal to which a light emitting element is mounted. The base is mainly constituted by a conductive member for supplying power to the light emitting element and a base material that holds the conductive member. Examples of modes of the base include a package having a lead frame and a molded body and a wiring substrate having a substrate and a wiring. In addition, the base can also be fabricated by providing wiring by plating after a molded body is molded or by laminating thin plates provided with wiring in advance. Examples of modes of the base include a mode having a recessed portion (cup portion) and a mode with a flat plate shape that does not have a recessed portion (side walls). A mode with a recessed portion enables light intensity toward the front of the device to be easily enhanced, and a mode with a flat plate shape enables a light emitting element to be easily mounted. Examples of shapes of the element mounting surface of the base include a rectangular shape, a polygonal shape, a track shape (a shape of two semicircles attached to both ends of a rectangle), a circular shape, and an elliptical shape. In addition, a part of the element mounting surface of the base may be formed with increased width such as in the vicinity of a portion to which the element mounting surface is mounted.

(Lead Frame 101)

Examples of a base material of the lead frame include copper, iron, nickel, palladium, tungsten, chromium, aluminum, silver, gold, titanium, and alloys thereof. In particular, copper or a copper alloy is favorable from the perspective of heat radiation performance while iron or an iron alloy is favorable from the perspective of bonding reliability with a light emitting element. In particular, copper or iron copper provides high heat radiation performance and is therefore favorable. The lead frame can be fabricated by subjecting these metal plates to a process such as pressing or etching. In addition, a coat of silver, nickel, palladium, platinum, tin, gold, copper, rhodium or an alloy thereof, silver oxide, or an oxide of a silver alloy may be formed on a surface of the lead frame. In particular, a surface of a portion of the lead frame to which a light emitting element is bonded may be coated by silver. Such a coat may be formed by plating, depositing, sputtering, printing, coating, or the like.

(Molded Body 102)

Examples of a base material of the molded body include thermoplastic resins such as aliphatic polyamide resin, semi-aromatic polyamide resin, polyethylene terephthalate, polycyclohexane terephthalate, liquid crystal polymer, polycarbonate resin, syndiotactic polystyrene, polyphenylene ether, polyphenylene sulfide, polyether sulfone resin, polyether ketone resin, and polyarylate resin and thermosetting resins such as polybismaleimide triazine resin, epoxy resin, silicone resin, silicone modified resin, polyimide resin, and polyurethane resin. In addition, as a filler or a coloring pigment, particles or fibers of glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, silicon carbide, antimony oxide, zinc stannate, zinc borate, iron oxide, chromium oxide, manganese oxide, and carbon black may be mixed into the base materials listed above. Alternatively, the molded body may be formed using glass, ceramics, and the like. As methods of molding the molded body, insert molding, injection molding, extrusion molding, transfer molding, and the like can be used.

(Wiring 121)

The wiring is formed at least on the upper surface of the base. The wiring may also be formed inside and on the lower surface or side surfaces of the base. In addition, the wiring may include a land (die pad) portion to which the light emitting element is bonded, a terminal portion for external connection, and a lead-out wiring portion that connects these portions. Examples of materials of the wiring include copper, nickel, palladium, tungsten, chromium, titanium, aluminum, silver, gold, and alloys thereof. In particular, copper or a copper alloy is favorable from the perspective of heat radiation performance. A coat of silver, platinum, tin, gold, copper, rhodium or an alloy thereof, silver oxide, or an oxide of a silver alloy may be formed on a surface of the wiring. In particular, a surface of a portion of the wiring to which a light emitting element is bonded may be coated by silver. Such a wiring or a coat may be formed by cofiring, postfiring, plating, depositing, sputtering, printing, coating, or the like.

(Substrate 122)

The substrate may be made of a base material with an electrically insulating property. Even when a conductive base material is used, the substrate can be electrically insulated from the wiring via an insulating film or the like. Examples of the base material of the base that constitutes the wiring substrate include ceramics containing aluminum oxide, aluminum nitride, zirconium oxide, zirconium nitride, titanium oxide, titanium nitride or a mixture thereof, metals containing copper, iron, nickel, chromium, aluminum, silver, gold, titanium or an alloy thereof, resins such as epoxy resin, BT resin, and polyimide resin or a fiber reinforced resin thereof (using glass, alumina, or the like as a reinforcing material). A flexible substrate may also be used. A white pigment such as titanium oxide may be mixed into the resin of the base material in order to reflect light from the light emitting element in an efficient manner.

(Light Emitting Element 20)

A semiconductor light emitting element such as an LED element can be used as the light emitting element. While a top view shape of the light emitting element is favorably a quadrangle and particularly a rectangle or a square, other shapes may also be adopted. In addition, the top view shape of the light emitting element may be modified in accordance with the shape of the base such as by adopting a rectangular shape that is elongated in the horizontal direction when the base is elongated in the horizontal direction. While a side surface of the light emitting element may be inclined inward or outward with respect to an upper surface thereof, the side surface is favorably approximately perpendicular to the upper surface. A thickness of the light emitting element is, for example, 0.02 mm or more and 1 mm or less, and favorably 0.05 mm or more and 0.5 mm or less from the perspectives of element strength and thickness of the light emitting device. As the light emitting element, an element structure constituted by various semiconductors and provided with a pair of positive and negative electrodes may suffice. The light emitting element generally has a substrate provided with the element structure. The substrate may be a crystal growth substrate capable of growing crystals of a semiconductor that constitutes an element structure or may be a bonding substrate to be bonded to an element structure that is separated from a crystal growth substrate. Examples of a base material of the crystal growth substrate include sapphire, spinel, gallium nitride, aluminum nitride, silicon, silicon carbide, gallium arsenide, gallium phosphide, indium phosphide, zinc sulfide, zinc oxide, zinc selenide, and diamond. Examples of a base material of the bonding substrate include silicon, silicon carbide, aluminum nitride, copper, and copper-tungsten. While a light emitting element that emits ultraviolet light may be used, a light emitting element that emits visible light is favorable for the purpose of obtaining mixed color light with wavelength converted light emitted from the fluorescent body. In the case of a light emitting device that emits white light, in consideration of a color mixing relationship with the wavelength converted light emitted from the fluorescent body, an emission wavelength of the light emitting element is favorably 400 nm or more and 530 nm or less and more favorably 420 nm or more and 490 nm or less. In particular, a light emitting element of a nitride semiconductor ($In_xAl_yGa_{1-x-y}N$, $0 \leq x$, $0 \leq y$, $x+y \leq 1$) capable of efficiently exciting the fluorescent body is favorable. Alternatively, a light emitting element made of a gallium arsenide based semiconductor or a gallium phosphide based semiconductor that emits green to red light is also favorable. In the case of a light emitting element in which the pair of positive and negative electrodes are provided on a same surface, face-up mounting in which each electrode is connected to a conductive member of the base by a wire or face-down (flip-chip) mounting in which each electrode is connected to a conductive member of the base by a conductive adhesive may be adopted as a mounting mode. In the case of face-down mounting, a bat wing type light intensity distribution may be produced. Alternatively, a light emitting element with a counter electrode structure in which each of the pair of positive and negative electrodes are provided on opposite surfaces may be used. By providing a metallic layer made of silver or aluminum or a dielectric reflection film on the side of the mounting surface of the light emitting element, light extraction efficiency can be enhanced. One or a plurality of light emitting elements may be mounted to one light emitting device, whereby sizes, shapes, and emission wavelengths of the light emitting elements may be arbitrarily selected. For example, light emitting elements that emit red light, green light, and blue light may be mounted to one light emitting device. While the plurality of light emitting elements may be arranged irregularly, a favorable light distribution can be more easily obtained by regularly or periodically arranging the plurality of light emitting elements in a matrix pattern, a concentric pattern, or the like. In addition, the plurality of light emitting elements may be connected in series or in parallel by a conductive member of the base or a wire. Moreover, positions of the light emitting elements in the vertical direction (for example, the device lateral direction) on the element mounting surface of the base may be approximately centered or may be deviated upward or downward. For example, by having the light emitting elements deviated upward, a space on a lower side of the light emitting elements can be widened and a large amount of the fluorescent body can be placed in the space.

(Fluorescent Body 30)

The fluorescent body absorbs at least a part of primary light emitted from the light emitting element and emits secondary light with a different wavelength from the primary light. While a fluorescent body that emits ultraviolet light may be used, a fluorescent body that emits visible light is favorable for the purpose of obtaining mixed color light with light emitted from the light emitting element. Examples of the fluorescent body include a nitride-based fluorescent body and an oxynitride-based fluorescent body that are mainly activated by a lanthanoid element such as Eu and Ce, an $\alpha$ or $\beta$ sialon-type fluorescent body that is activated by Eu, various alkaline earth metal silicate nitride fluorescent bodies, an alkaline earth metal halogen apatite fluorescent body, an alkaline earth halosilicate fluorescent body, an alkaline earth metal silicate fluorescent body, an alkaline earth metal halogen borate fluorescent body, an alkaline earth metal aluminate fluorescent body, an alkaline earth metal silicate, an alkaline earth metal sulfide, an alkaline earth metal thiogallate, an alkaline earth metal silicon nitride, and germinate that are mainly activated by a lanthanoid element such as Eu or a transition metal element such as Mn, a rare earth aluminate and a rare earth silicate that are mainly activated by a lanthanoid element such as Ce, and organics, organic complexes, and the like that are mainly activated by a lanthanoid element such as Eu. Moreover, fluorescent bodies capable of producing similar performances and effects can be used in addition to the above. Due to these fluorescent bodies, a light emitting device that emits mixed color light (for example, white) of primary light and secondary light in a visible wavelength range and a light emitting device which is excited by ultraviolet primary light and which emits secondary light in a visible wavelength range can be provided.

(Coating Member 40)

The coating member is a member which coats the light emitting element and protects the light emitting element from dust, moisture, external forces, and the like. A base material of the coating member may be any material which has an electrically insulating property, which is capable of transmitting (favorably, at a transmittance of 70% or higher) light emitted from the light emitting element, and which has fluidity prior to solidification. Specific examples include silicone resin, silicone modified resin, epoxy resin, phenolic resin, polycarbonate resin, acrylic resin, TPX resin, polynorbornene resin or a hybrid resin containing one or more of these resins. Glass may also be used. Among the resins listed above, silicone resin is favorable due to superior heat resistance and light resistance and small volume shrinkage after solidification. Various functional particles such as a filler and a fluorescent body may be added into the base material of the coating member. A diffusing agent or a coloring agent can be used as the filler. Specific examples include silica, titanium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, and carbon black. The particles of the filler may have a crushed shape or a spherical shape. In addition, the particles may be hollow or porous. Furthermore, while the coating member may be constituted by a plurality of layers, the coating member is favorably constituted by a single layer. With a single layer coating member, since there is substantially no interface of the base material and reflection of light is suppressed, light extraction efficiency can be more easily enhanced. In addition, adhesion of the coating member can be improved and occurrences of gaps between the layers or separation of the layers can be avoided.

(Protective Element 50)

The protective element is an element that protects the light emitting element from static electricity or a high voltage surge. Specific examples include a Zener diode.

(Underfill 60)

The underfill may be constituted by a similar material as the coating member described earlier. In particular, the underfill is favorably constituted by a white resin such as silicone resin containing titanium oxide particles.

(Wire)

The wire is a member for electrically connecting electrodes of the light emitting element with a conductive member of the base. As the wire, a metal wire made of gold, copper, silver, platinum, aluminum or an alloy thereof can be used. In particular, a gold wire which is less susceptible to breakage due to stress from the coating member and which has superior heat resistance is favorable. In addition, at least a surface of the wire may be constituted by silver in order to enhance light extraction efficiency.

(Adhesive)

The adhesive is a member for fixing the light emitting element to the base. As the insulating adhesive, epoxy resin, silicone resin, polyimide resin, or modified resins or hybrid resins of these resins can be used. As a conductive adhesive, a conductive paste of silver, gold, or palladium, a solder such as a tin-bismuth solder, a tin-copper solder, a tin-silver solder, or a gold-tin solder, or a brazing material such as a low melting point metal may be used.

(Light Guiding Member 200)

Although the light guiding member normally has a plate shape (light guide plate), the light guiding member may also have a block shape, a rod shape, or the like. While the light guiding member favorably uses a side surface as a light entering surface and an upper surface as a light emitting surface, the light guiding member may alternatively use a lower surface (back surface) as a light entering surface and an upper surface as a light emitting surface. In addition to a rectangular shape, a planar shape of the light guiding member can be appropriately modified according to the intended use of the lighting device to a circular shape, a polygonal shape, or the like. The light guiding member may have an approximately uniform thickness across the entire area. Alternatively, the thickness may have partial variations such as the thickness becoming smaller the further away from the light emitting device or end portions on the side of the light entering surface gradually becoming thicker than main portions. In addition, recesses and projections may be formed on an upper surface and/or a lower surface of the light guiding member. Furthermore, recesses and projections may be formed at a portion that opposes the light emitting device. A base material of the light guiding member may be any material capable of transmitting (favorably, at a transmittance of 85% or higher) light emitted from the light emitting device. Specific examples include acrylic resin, polycarbonate resin, PMMA resin, polynorbornene resin, polystyrene resin, and glass. Moreover, not only in the case of a side emission type light emitting device, but also in the case of a top emission type light emitting device, the light emitting device can be arranged to the side of the light guiding member by opposing a primary light emitting surface to the light entering surface of the light guiding member.

EXAMPLES

Hereinafter, examples will be described in detail. It is needless to say that the present invention is not limited to the examples described below.

First Example

A light emitting device according to the first example is a side emission type SMD LED which shares the structure of the example shown in FIG. 1 and whose outside dimension is 0.8 mm (vertical: thickness upon mounting) by 2.8 mm (horizontal) by 1.0 mm (thickness).

A base is a package which includes two lead frames and a molded body that integrally holds the lead frames and which has a 0.66 mm (vertical) by 2.2 mm (horizontal) by 0.3 mm (depth) recessed portion at approximately center of an upper surface of the molded body. The two lead frames are made of a copper alloy with a silver-plated surface. A part of the lead frames constitute a recessed portion bottom surface and is extended to the outside of the molded body. The molded body is formed of a polyphthalamide resin containing titanium oxide and wollastonite.

A light emitting element is an approximately cuboid light emitting diode chip which is created by sequentially laminating an n type layer, an active layer, and a p type layer of a nitride semiconductor on top of a sapphire substrate, which is capable of emitting blue light (with a central wavelength of approximately 460 nm), and whose outside dimension is 0.3 mm (vertical) by 0.7 mm (horizontal) by 0.1 mm (thickness). The electrodes of the light emitting element are provided on a side of an upper surface (semiconductor layer) and includes a pad electrode for bonding and an extension electrode that is extended from the pad electrode. The light emitting element is bonded by an adhesive that is a translucent silicone resin onto one of (negative electrode side) the lead frames in the recessed portion of the base. The pad electrodes of the light emitting element are respectively connected to positive and negative electrode lead frames by gold wire.

A coating member is filled into the recessed portion of the base so as coat the light emitting element and the wire. An upper surface of the coating member is an approximately same surface (a slightly recessed surface due to hardening shrinkage) to the upper surface of the molded body. The base material of the coating member is a silicone resin containing a YAG:Ce fluorescent body and a silica filler. The fluorescent body is deposited at positions other than directly above the light emitting element around the light emitting element in the coating member. In addition, the fluorescent body exists from the recessed portion bottom surface to above the recessed portion side wall surface that is an inclined surface and reaches a position that is higher than the upper surface of the light emitting element.

A lighting device according to the first example includes a light emitting device configured as described above and a light guiding member and can be used as a backlight of a liquid crystal display (screen size: 4.2 inches). The light guiding member is a light guiding plate made of acrylic resin with a thickness of 1.0 mm and a top view rectangular shape (effective light emission area: 55.6 mm (vertical) by 91.8 mm (horizontal)). Nine light emitting devices are lined up at 6.5 mm intervals so as to oppose a side surface of the light guiding member and are mounted to a circuit board. The light emitting devices are arranged in close contact with the side surface of the light guiding member. Moreover, a reflective sheet is provided below the light guiding member and a diffusion sheet, a prism sheet, and a polarizing sheet are provided above the light guiding member.

Second Example

A lighting device according to the second example substantially shares the same configuration as the first example with the exception of the light emitting devices being arranged at a distance CL of 0.25 mm from the side surface of the light guiding member.

First Comparative Example

A lighting device according to the first comparative example substantially shares the same configuration as the first example with the exception of using light emitting devices in which a fluorescent body is deposited across an entire area on an element mounting surface including directly above a light emitting element. In addition, a formulation concentration of the fluorescent body is adjusted so as to produce similar light emission chromaticity to the light emitting device according to the first example.

Second Comparative Example

A lighting device according to the second comparative example substantially shares the same configuration as the first comparative example with the exception of the light emitting devices being arranged at a distance CL of 0.25 mm from the side surface of the light guiding member.
<First Evaluation>

The light emitting devices according to the first example and the first comparative example are driven by a constant current of 20 mA to evaluate respective light fluxes and light intensities (based on average values of nine light emitting devices). The light flux of the light emitting device according to the first example is 7.522 [lm] (chromaticity (x, y)=(0.292, 0.267)) and the light flux of the light emitting device according to the first comparative example is 7.518 [lm] (chromaticity (x, y)=(0.292, 0.273)). The light intensity of the light emitting device according to the first example is 2.537 [cd] (chromaticity (x, y)=(0.284, 0.252)) and the light intensity of the light emitting device according to the first comparative example is 2.473 [cd] (chromaticity (x, y)=

(0.285, 0.259)). It is assumed that chromaticity (x value, y value) as described in the present specification conforms to an xyz colorimetric system as defined by the International Commission on Illumination (CIE). As described above, a comparison of the light emitting devices according to the first example and the first comparative example reveals approximately equal light fluxes (strictly speaking, the light flux of the light emitting device according to the first example is higher by 0.4%) but light intensity is higher for the light emitting device according to the first example by 2.5%. In this manner, it is shown that the light emitting device according to the first example is capable of realizing significantly high light extraction efficiency.

<Second Evaluation>

Figure 12A:
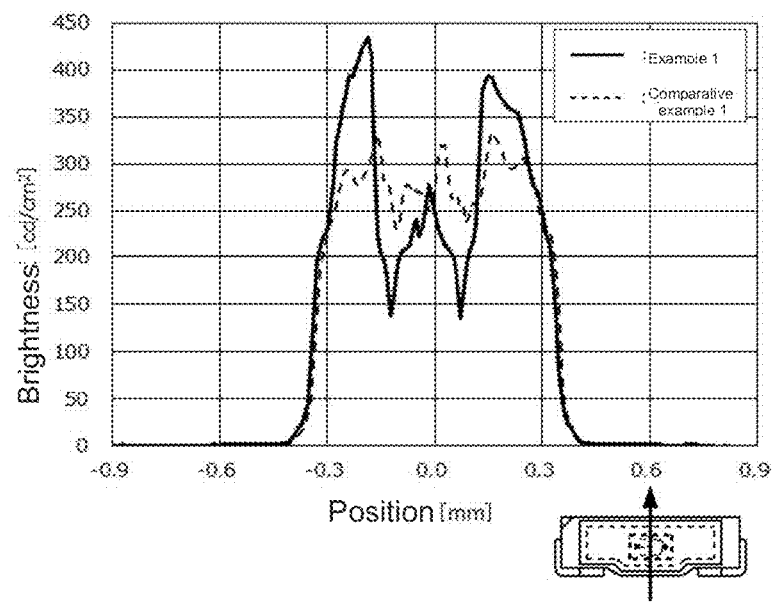
FIGS. 12A and 12B are graphs showing distributions of brightness in light emitting devices according to an example and a comparative example.
Figure 12B:
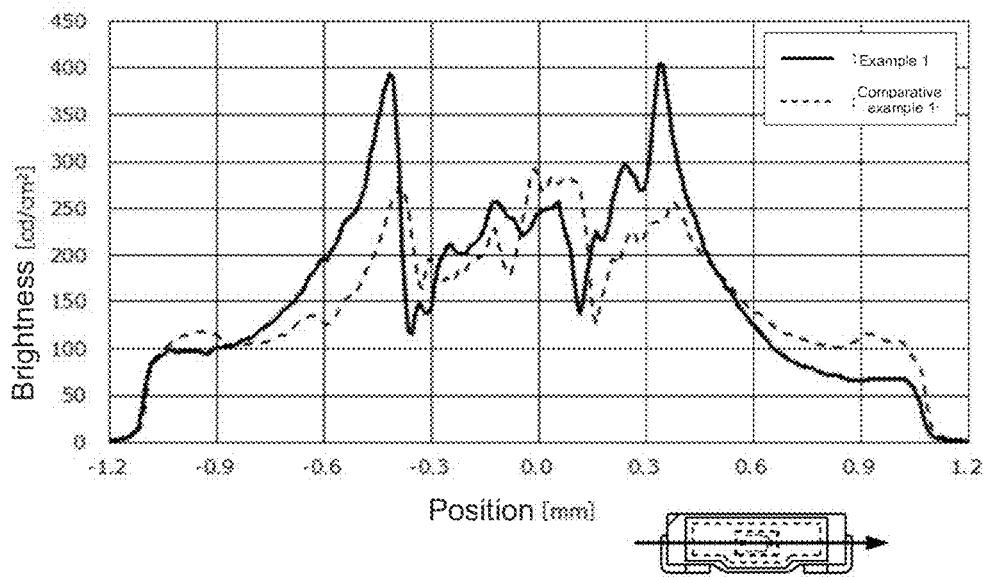
Figure 13A:
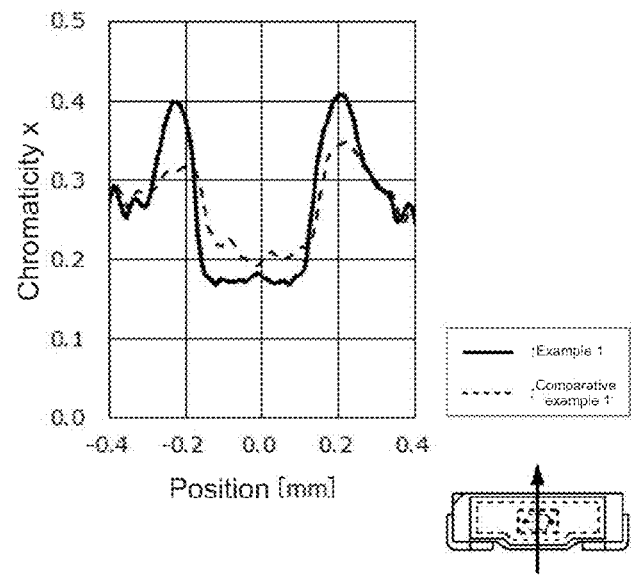
FIGS. 13A and 13B are graphs showing distributions of chromaticity x in light emitting devices according to an example and a comparative example.
Figure 13B:
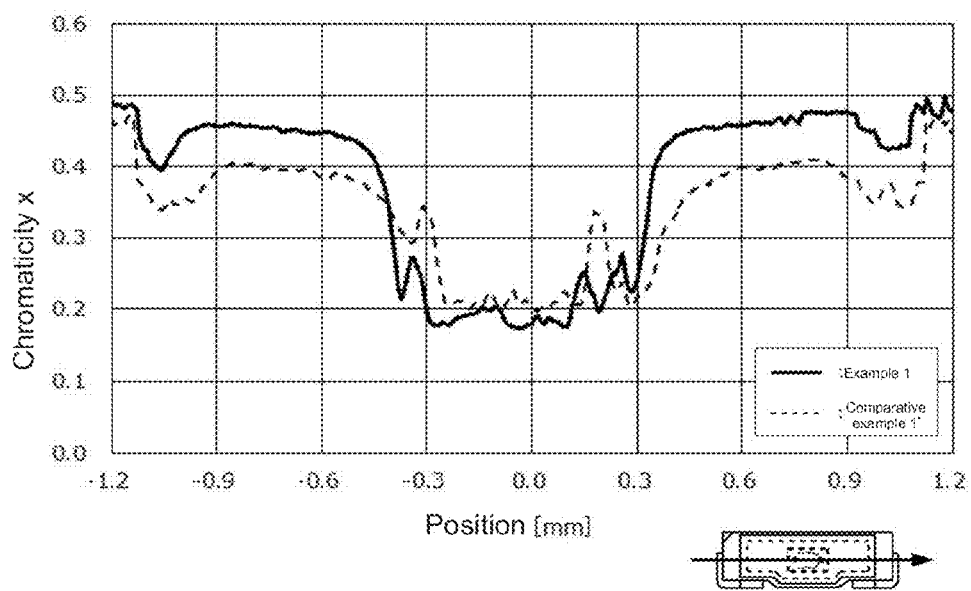
Figure 14A:
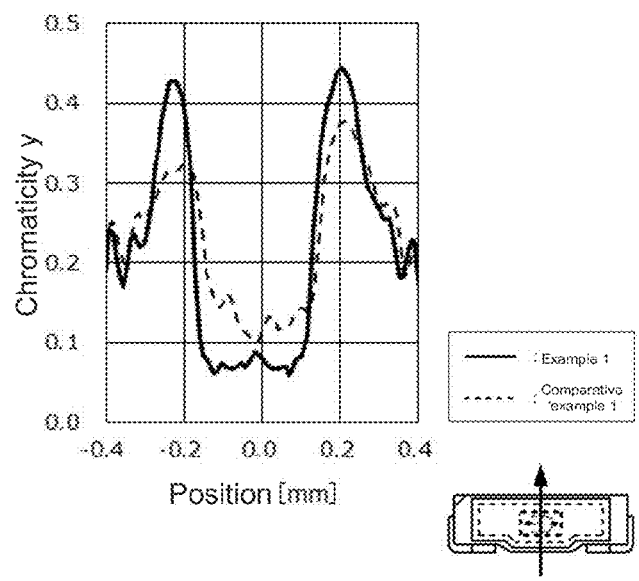
FIGS. 14A and 14B are graphs showing distributions of chromaticity y in light emitting devices according to an example and a comparative example.
Figure 14B:
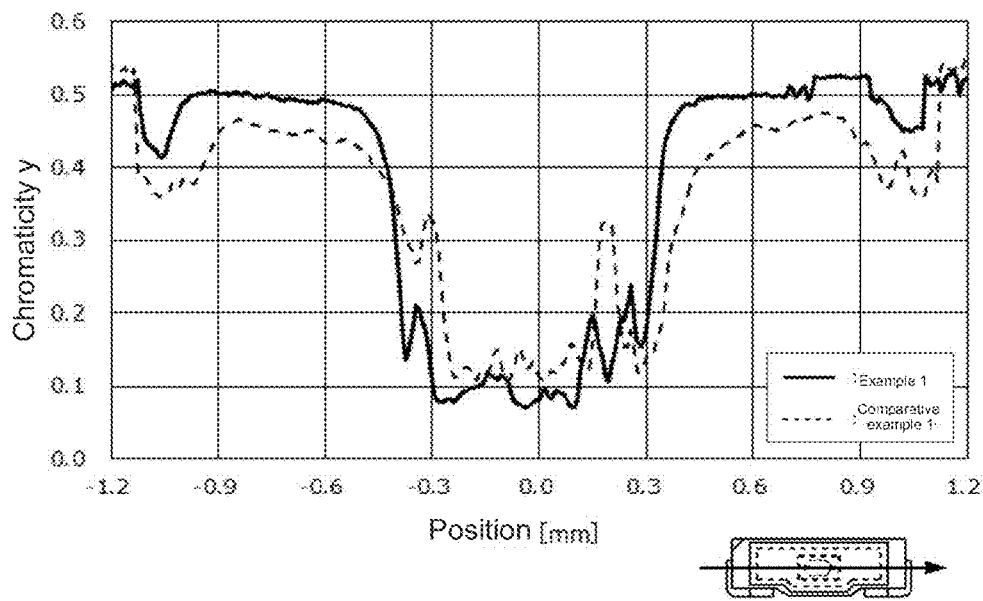

The light emitting devices according to the first example and the first comparative example are driven by a constant current of 20 mA to evaluate respective brightness distributions and chromaticity distributions. A near-field measurement system "SIG-300" (manufactured by Radiant Imaging, camera model number: PM-1603F-1) is used as a measurement device. FIGS. 12A and 12B are graphs showing distributions of brightness in light emitting devices according to the first example and the first comparative example. FIGS. 13A and 13B are graphs showing distributions of chromaticity x in light emitting devices according to the first example and the first comparative example. FIGS. 14A and 14B are graphs showing distributions of chromaticity y in light emitting devices according to the first example and the first comparative example. Moreover, the respective A diagrams represent measurement data in a lateral direction (the y direction in FIG. 1A) of the light emitting device and the respective B diagrams represent measurement data in a longitudinal direction (the x direction in FIG. 1A) of the light emitting device.

As shown in FIGS. 12A and 12B, the brightness of the light emitting device according to the first example reaches maximum in a vicinity of a side surface of a light emitting element. More specifically, the brightness of the light emitting device according to the first example has a local maximum value of approximately 400 cd/cm$^2$ in a vicinity of side surfaces on both sides of the light emitting element and, although a decline in brightness is observed at positions of electrodes of the light emitting element, the brightness has a value of around 200 to 250 cd/cm$^2$ on the light emitting element. Therefore, the graphs shown in FIGS. 12A and 12B represent (strictly speaking, with the exception of a decline in brightness due to electrodes of the light emitting element) a trend of a bimodal distribution in which brightness is low above the light emitting element and higher at outer edges of the light emitting element than above the light emitting element. On the other hand, the brightness of the light emitting device according to the first comparative example is around 300 cd/cm$^2$ in FIG. 12A and around 250 cd/cm$^2$ in FIG. 12B both above the light emitting element and at the outer edges of the light emitting element and a characteristic variation such as that of the first example is not observed.

As shown in FIGS. 13A and 13B and in FIGS. 14A and 14B, chromaticity of the light emitting device according to the first example is around chromaticity (x, y)=(0.18, 0.08) above the light emitting element, and around chromaticity (x, y)=(0.40, 0.42) in the A diagrams and around chromaticity (x, y)=(0.45, 0.50) in the B diagrams on an outer side of the light emitting element. Chromaticity of the light emitting device according to the first comparative example is around chromaticity (x, y)=(0.21, 0.13) above the light emitting element and around chromaticity (x, y)=(0.32, 0.32) in the A diagrams and around chromaticity (x, y)= (0.38, 0.45) in the B diagrams on an outer side of the light emitting element. Therefore, compared to the light emitting device according to the first comparative example, the light emitting device according to the first example approaches blue above the light emitting element and approaches yellow on the outer side of the light emitting element. In other words, compared to the light emitting device according to the first comparative example, the light emitting device according to the first example is observed to have stronger chromaticity of a primary light component above the light emitting element and stronger chromaticity of a secondary light component on the outer side the light emitting element.

In addition, as shown in FIGS. 13A and 13B and in FIGS. 14A and 14B, light emission chromaticity in the x direction and the y direction suddenly varies to a level that can be approximated to near vertical at a position of the light emitting element (in the vicinity of the side surface). As shown, a feature unique to the light emitting device according to the first example is that the light emission chromaticity of the light emitting device in one direction (the x direction or the y direction) as measured in a near field exhibits a rectangular wave-like profile at the position of the light emitting element. This applies not only to chromaticity but also to brightness as shown in FIG. 3. In addition, more favorably, a difference (Δx, Δy) between a maximum value and a minimum value directly above the light emitting element and at an outer periphery of the light emitting element in one direction (the x direction or the y direction) as measured in a near field is Δx≥0.2, Δy≥0.3. Moreover, measuring in a "near field" means that characteristics at a main light emitting surface of a light emitting device (in the present example, the upper surface of the coating member) are measured.

<Third Evaluation>

Figure 15A:
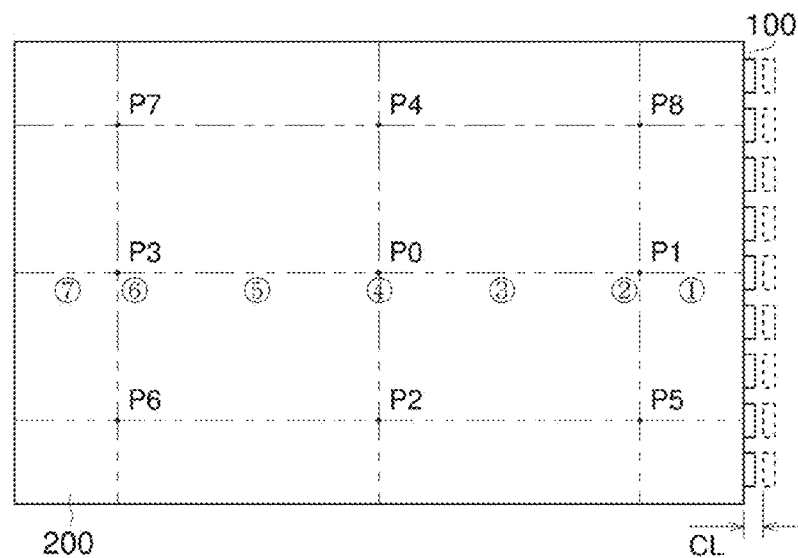
FIG. 15A is a schematic top view showing positions on a light guiding member in lighting devices according to an example and a comparative example.
Figure 15B:
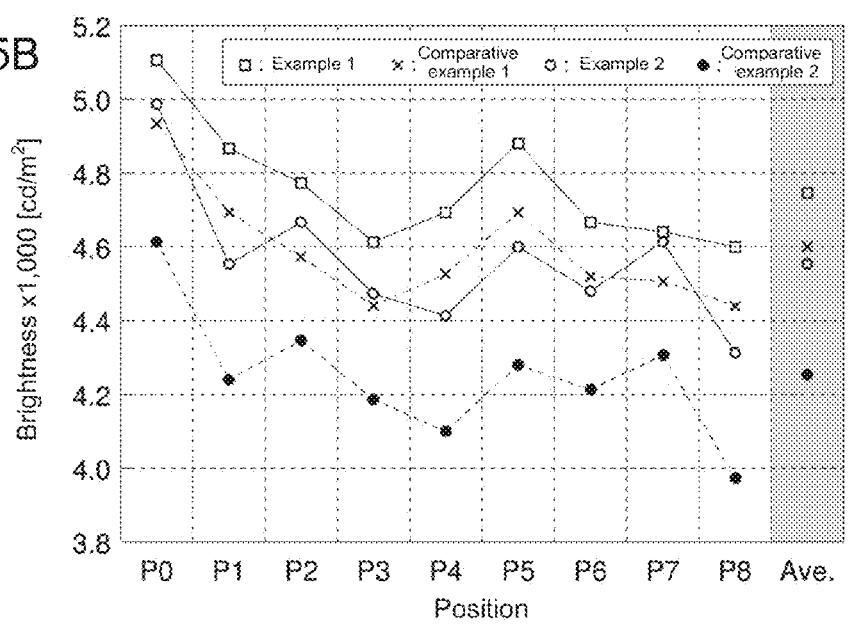
FIG. 15B is a graph showing brightness at the positions.
Figure 16:
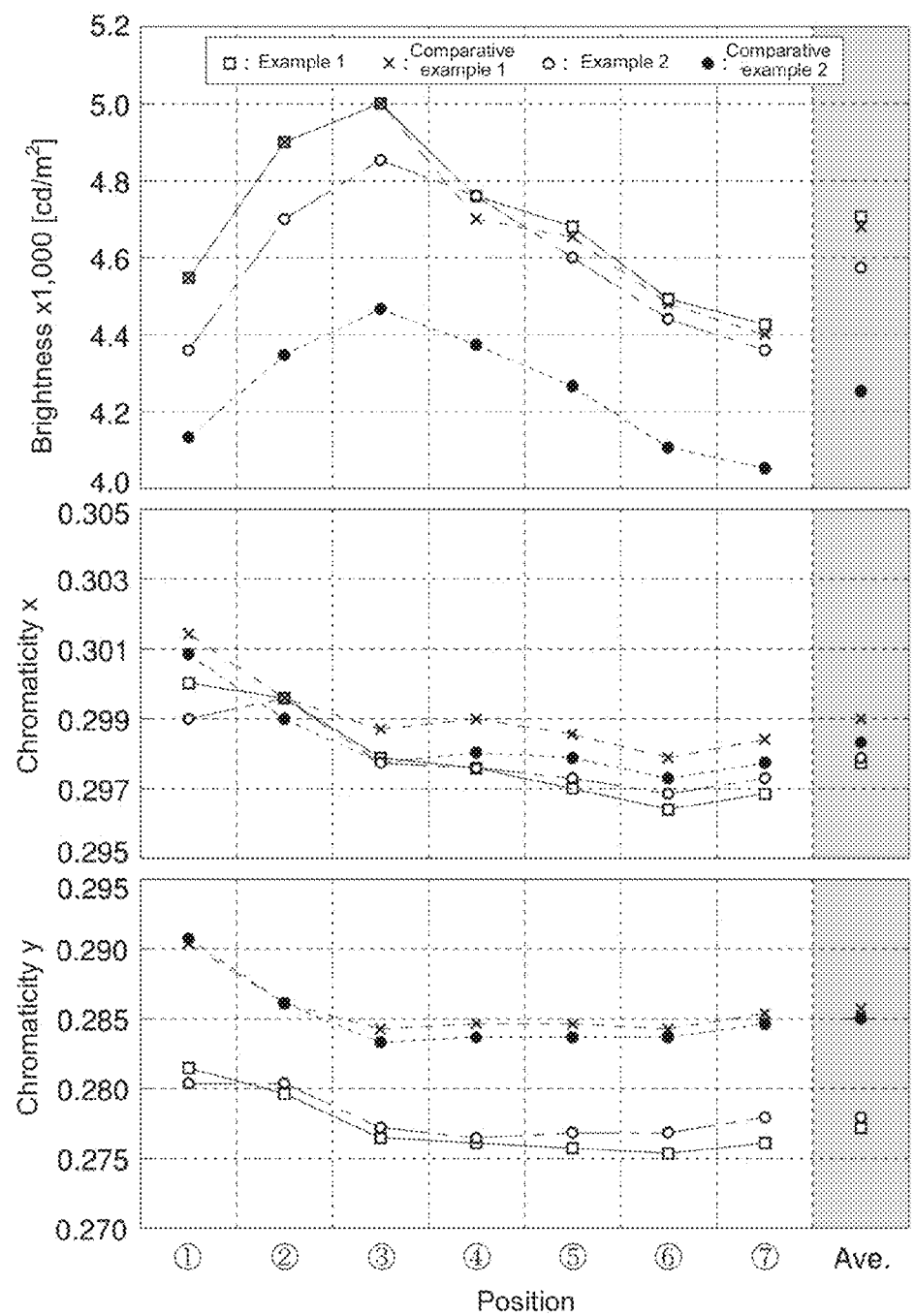
FIG. 16 is a graph showing distributions of brightness and chromaticity at a central part of a light guiding member in lighting devices according to an example and a comparative example.

The lighting devices according to the first and second examples and the first and second comparative examples are driven by a constant current of 20 mA to evaluate respective brightness and chromaticity. FIG. 15A is a schematic top view showing positions on a light guiding member in the lighting devices according to the first and second examples and the first and second comparative examples, and FIG. 15B is a graph showing brightness at the positions. In addition, FIG. 16 is a graph showing distributions of brightness and chromaticity at a central part of a light guiding member in the lighting devices according to the first and second examples and the first and second comparative examples. As shown in the brightness distribution graphs in FIGS. 15B and 16, the brightness of the lighting devices according to the first and second examples is higher than that of the lighting devices according to the first and second comparative examples. In addition, judging from the fact that the lighting device according to the second example maintains higher brightness than the lighting device according to the second comparative example even when the light emitting device is arranged separated from the light guiding member, the light emitting devices according to the first and second examples obviously offer high light intensity toward the front of the device and provide high optical coupling efficiency to the light guiding member. Furthermore, unevenness (variation) in brightness distribution is at approximately similar levels for all lighting devices according to the first and second examples and the first and second comparative examples. In addition, as shown in the chromaticity distribution graph in FIG. 16, unevenness (variation) in chromaticity distribution is at approximately similar levels for all lighting devices according to the first and second examples and the first and second comparative examples. As shown, the combinations of the light emitting device and the light guiding member according to the first and second examples produce a lighting device capable of emitting light with reduced uneven coloring and with high light emitting efficiency.

Moreover, a lighting device can also be configured so as to include a light emitting device according to the embodiments and a light emitting device in which a fluorescent body also exists directly above a light emitting element as in the case of the light emitting devices according to the first and second comparative examples described earlier. Accordingly, a chromaticity distribution of the lighting device can be adjusted. In this case, favorably, the light emitting device according to the embodiments and the light emitting device in which a fluorescent body also exists directly above a light emitting element are alternately arranged.

According to the first to fifth embodiments described above, a light emitting device capable of realizing significantly high light extraction efficiency while obtaining wavelength converted light due to a fluorescent body can be obtained. In addition, by combining such a light emitting device with a light guiding member, a lighting device can be obtained which is capable of emitting light with reduced uneven coloring and with high light emitting efficiency.

Sixth Embodiment

Figure 17:
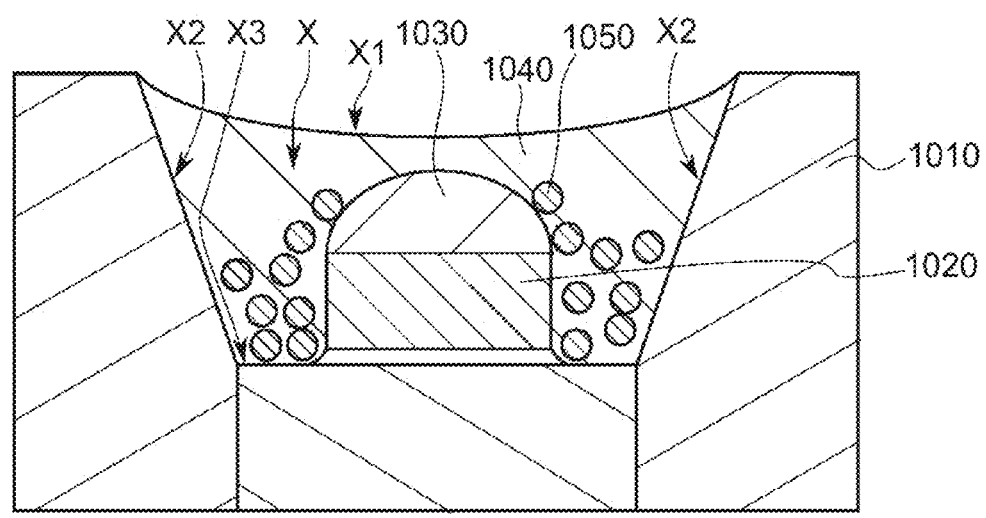
FIG. 17 is a schematic view showing a general configuration of a light emitting device according to a sixth embodiment.

FIG. 17 is a schematic view showing a general configuration of a light emitting device according to a sixth embodiment.

As shown in FIG. 17, the light emitting device according to the sixth embodiment is a light emitting device which includes a package 1010 having a recessed portion X, a light emitting element 1020 mounted into the recessed portion X of the package 1010, a translucent member 1030 provided above the light emitting element 1020, a sealing resin 1040 that seals the recessed portion X of the package 1010, and a fluorescent body 1050 contained in the sealing resin 1040, and in which the fluorescent body 1050 is distributed to the side of the light emitting element 1020 in a larger amount than above the light emitting element 1020 and a side surface of the light emitting element 1020 is exposed with respect to the sealing resin 1040.

Hereinafter, the components will be described in order.

(Package 1010)

For the package 1010, for example, a thermoplastic resin such as PPA (polyphthalamide), PPS (polyphenylene sulfide), liquid crystal polymer, and nylon, a thermosetting resin such as epoxy resin, silicone resin, modified epoxy resin, modified silicone resin, urethane resin, and acrylate resin as well as glass epoxy resin, ceramics, glass, or the like can be used. Moreover, as ceramics, alumina, aluminum nitride, mullite, silicon carbide, or silicon nitride is favorably used. Alumina and mullite are particularly favorable due to their high reflectance and low cost.

The recessed portion X included in the package 1010 has a bottom surface X3 that is flat enough to allow mounting of the light emitting element 1020 and has a shape that can be filled by the sealing resin 1040. Examples of such a recessed portion X includes a recessed portion with a trapezoidal cross section (refer to FIG. 17). With the package 1010 having a recessed portion with a trapezoidal cross section (refer to FIG. 17), since light emitted from the light emitting element 1020 is reflected at a recessed portion side wall X2 toward a recessed portion opening X1, light extraction efficiency of the light emitting device is improved.

(Light Emitting Element 1020)

For example, a light emitting diode can be used as the light emitting element 1020. As the light emitting diode, for example, a light emitting diode can be used which has a growth substrate (for example, a sapphire substrate) with insulating and light-transmitting properties and a laminated structure including an active layer formed on the growth substrate. Moreover, the laminated structure including an active layer may be formed by various semiconductors (for example, a nitride semiconductor such as InN, AlN, GaN, InGaN, AlGaN, and InGaAlN, a III-V group compound semiconductor, and a II-VI group compound semiconductor).

While a mounting method of the light emitting element 1020 is not particularly limited, for example, the light emitting element 1020 can be mounted to the recessed portion X of the package 1010 by arranging the side of the growth substrate to be a mounting surface. In this case, for example, the light emitting element 1020 is electrically connected to an external electrode of the package 1010 by wire bonding. On the other hand, the light emitting element 1020 can be mounted to the recessed portion X of the package 1010 by arranging the side of the laminated structure including an active layer to be a mounting surface. In this case, for example, the light emitting element 1020 is electrically connected to an external electrode of the package 1010 by flip-chip mounting.

The side surface of the light emitting element 1020 is exposed with respect to the sealing resin 1040. Even if the fluorescent body 1050 is distributed to the side of the light emitting element 1020 in a larger amount than above the light emitting element 1020, if the translucent member 1030 coats the side surface of the light emitting element 1020, light emitted from the side surface of the light emitting element 1020 is reflected (in particular, totally reflected) by the translucent member 1030. Therefore, in this case, light emitted from the side surface of the light emitting element 1020 cannot be efficiently used to excite the fluorescent body 1050. However, by exposing the side surface of the light emitting element 1020 with respect to the sealing resin 1040, since the side surface of the light emitting element 1020 is not coated by the translucent member 1030, light emitted from the side surface of the light emitting element 1020 can be efficiently used to excite the fluorescent body 1050.

(Translucent Member 1030)

A member having a property of transmitting light from the light emitting element 1020 is used as the translucent member 1030. Although the degree of translucency is not particularly limited, for example, in addition to a member that transmits 100% of light emitted from the light emitting element 1020, a member that transmits around 70% or more, 80% or more, 90% or more, or 95% or more of light emitted from the light emitting element 1020 is favorably used as the translucent member 1030.

As the translucent member 1030, a member having light-resistant and insulating properties in addition to transmitting light from the light emitting element 1020 is favorably used. Examples of members having such properties include organics such as silicone resin, epoxy resin, urea resin, fluororesin and hybrid resins containing at least one of these resins (for example, a silicone resin composition, a modified silicone resin composition, an epoxy resin composition, a modified epoxy resin composition, and an acrylic resin composition).

While the translucent member 1030 may be provided above the light emitting element 1020, the translucent member 1030 is favorably provided at a position where an amount of the fluorescent body 1050 that is distributed in an area sandwiched between the translucent member 1030 and the light emitting element 1020 is small among above the light emitting element 1020 and is more favorably provided on an upper surface of the light emitting element 1020 as shown in FIG. 17. Accordingly, since the amount of the fluorescent body 1050 distributed above the light emitting element 1020 is reduced (or becomes zero), the frequency of light emitted from the upper surface of the light emitting element 1020 being reflected by the fluorescent body 1050 declines and, as a result, the light emitted from the upper surface of the light emitting element 1020 can be more easily extracted from the recessed portion opening X1 of the package 1010.

A member having a surface that prevents deposition of the fluorescent body 1050 is favorably used as the translucent member 1030. Accordingly, since the amount of the fluorescent body 1050 distributed above the light emitting element 1020 is reduced (or becomes zero), the frequency of light emitted from the upper surface of the light emitting element 1020 being reflected by the fluorescent body 1050 declines and, as a result, the light emitted from the upper surface of the light emitting element 1020 can be more easily extracted from the recessed portion opening X1 of the package 1010.

In addition, as the translucent member 1030, favorably, a member that is projected with respect to the recessed portion opening X1 of the package 1010 (refer to FIG. 17), a member having a height approaching the recessed portion opening X1 of the package 1010 (refer to FIG. 18), a member that is projected with respect to the light emitting element 1020 (for example, an inverse trapezoidal shape), or a member that combines these shapes is used.

As a member that is projected with respect to the recessed portion opening X1 of the package 1010, members having a trapezoidal shape, a dome shape, or a semi-cylindrical shape (a shape in which a curved surface side of a bisected cylinder faces the recessed portion opening X1 of the package 1010 and a flat surface side faces the light emitting element 1020) can be used. Among these members, a member having a shape that is less likely to totally reflect the light from the light emitting element 1020 is favorably used. Examples of such members include a lens-like member having a curvature radius of 0.66 mm in a longitudinal direction and 0.16 mm in a lateral direction when a height of the sealing resin 1040 is approximately 100 µm.

A member that is projected with respect to the recessed portion opening X1 of the package 1010 is favorably provided by, for example, potting a thermosetting resin on the upper surface of the light emitting element 1020 and hardening the thermosetting resin. Accordingly, due to surface tension of the thermosetting resin, a surface of the projection acquires a shape that prevents deposition of the fluorescent body 1050.

A microstructure such as recesses and projections or a microlens is favorably provided on the surface of the translucent member 1030. Accordingly, since reflection at an interface of the translucent member 1030 and the sealing resin 1040 is reduced, light extraction efficiency of the light emitting device increases. Moreover, since the sealing resin 1040 is not hardened and readily spreads to its surroundings during a forming step thereof, even if recesses and projections are formed on the translucent member 1030, the fluorescent body 1050 does not accumulate (or only a small amount accumulates) on the recesses and projections.

(Sealing Resin 1040)

For example, materials similar to those described for the translucent member 1030 above can be used as the sealing resin 1040.

For example, the sealing resin 1040 is provided by potting a resin in the recessed portion X of the package 1010 and hardening the resin.

Moreover, a height of the light emitting element 1020, a height of the translucent member 1030, and a height of the sealing resin 1040 favorably have a relationship expressed as (height of the sealing resin 1040−height of the light emitting element 1020−height of the translucent member 1030)≤300 µm, more favorably have a relationship expressed as (height of the sealing resin 1040−height of the light emitting element 1020−height of the translucent member 1030)≤150 µm, and even more favorably have a relationship expressed as (height of the sealing resin 1040−height of the light emitting element 1020−height of the translucent member 1030)≤50 µm. Accordingly, since the amount of the fluorescent body 1050 distributed above the light emitting element 1020 is reduced (or becomes zero), the frequency of light emitted from the upper surface of the light emitting element 1020 being reflected by the fluorescent body 1050 declines and, as a result, the light emitted from the upper surface of the light emitting element 1020 can be more easily extracted from the recessed portion opening X1 of the package 1010.

(Fluorescent Body 1050)

The fluorescent body 1050 exists to the side of the light emitting element 1020 in a larger amount than above the light emitting element 1020. Accordingly, since the amount of the fluorescent body 1050 distributed above the light emitting element 1020 becomes smaller than the amount of the fluorescent body 1050 distributed to the side of the light emitting element 1020 (or becomes zero), the frequency of light emitted from the upper surface of the light emitting element 1020 being reflected by the fluorescent body 1050 declines and, as a result, the light emitted from the upper surface of the light emitting element 1020 can be more easily extracted from the recessed portion opening X1 of the package 1010. In addition, since the amount of the fluorescent body 1050 distributed to the side of the light emitting element 1020 becomes larger than the amount of the fluorescent body 1050 distributed above the light emitting element 1020, the light emitted from the side surface of the light emitting element 1020 can be efficiently used to excite the fluorescent body 1050. Moreover, when the light emitted from the side surface of the light emitting element 1020 is efficiently used to excite the fluorescent body 1050, since it is more difficult for the light emitted from the side surface of the light emitting element 1020 to reach the recessed portion side wall X2 of the package 1010, the light emitted from the side surface of the light emitting element 1020 can be prevented from passing through the recessed portion side wall X2 of the package 1010 and exiting the package 1010.

Examples of the distribution described above include a mode such as that shown in FIG. 17 where the fluorescent body 1050 is deposited on the recessed portion bottom surface X3 of the package 1010. Such a mode can be formed by, for example, depositing the fluorescent body 1050 in the recessed portion X of the package 1010 before hardening the sealing resin 1040.

As the fluorescent body 1050, a fluorescent material that is excited by light emitted from the light emitting element 1020 and emits light can be used. While a fluorescent material that emits light with a shorter wavelength than the light emitted from the light emitting element 1020 can be used, a fluorescent material that emits light with a longer wavelength is more favorable. Accordingly, since the fluorescent body can efficiently emit light, light extraction efficiency of the light emitting device increases.

Examples of materials that can be used as the fluorescent material which emits light with a longer wavelength than the light emitted from the light emitting element 1020 include a nitride-based fluorescent body or an oxynitride-based fluorescent body that is mainly activated by a lanthanoid element such as Eu and Ce, an α or β sialon-type fluorescent body that is activated by Eu, various alkaline earth metal silicate nitride fluorescent bodies, an alkaline earth metal halogen apatite fluorescent body, an alkaline earth halosilicate fluorescent body, an alkaline earth metal silicate fluorescent body, an alkaline earth metal halogen borate fluorescent body, an alkaline earth metal aluminate fluorescent body, an alkaline earth metal silicate, an alkaline earth metal sulfide, an alkaline earth metal thiogallate, an alkaline earth metal silicon nitride, and germinate that are mainly activated by a lanthanoid element such as Eu or a transition metal element such as Mn, a rare earth aluminate and a rare earth silicate that are mainly activated by a lanthanoid element such as Ce, and organics, organic complexes, and the like that are mainly activated by a lanthanoid element such as Eu. Obviously, fluorescent materials which produce similar performances and effects to the fluorescent materials described above can also be used. Moreover, when a nitride semiconductor based light emitting element is used as the light emitting element 1020, for example, a fluorescent body (fluorescent material) such as a YAG fluorescent body (yellow fluorescent material) or a LAG fluorescent body (yellow fluorescent material) is favorably used.

When the fluorescent body 1050 is deposited lower than the active layer of the light emitting element 1020 to the side of the light emitting element 1020, since light emitted from a side surface in an area below the active layer of the light emitting element 1020 (for example, the growth substrate) enters the fluorescent body 1050 immediately after being emitted, the light emitted from a side surface in an area below the active layer of the light emitting element 1020 (for example, the growth substrate) can be efficiently used to excite the fluorescent body 1050.

On the other hand, when the fluorescent body 1050 is deposited higher than the active layer of the light emitting element 1020 to the side of the light emitting element 1020, since light emitted from a side surface of the active layer of the light emitting element 1020 in addition to light emitted from a side surface in an area below the active layer of the light emitting element 1020 (for example, the growth substrate) enters the fluorescent body 1050 immediately after being emitted, both the light emitted from a side surface in an area below the active layer of the light emitting element 1020 (for example, the growth substrate) and the light emitted from a side surface of the active layer of the light emitting element 1020 can be efficiently used to excite the fluorescent body 1050.

Seventh Embodiment

Figure 18:
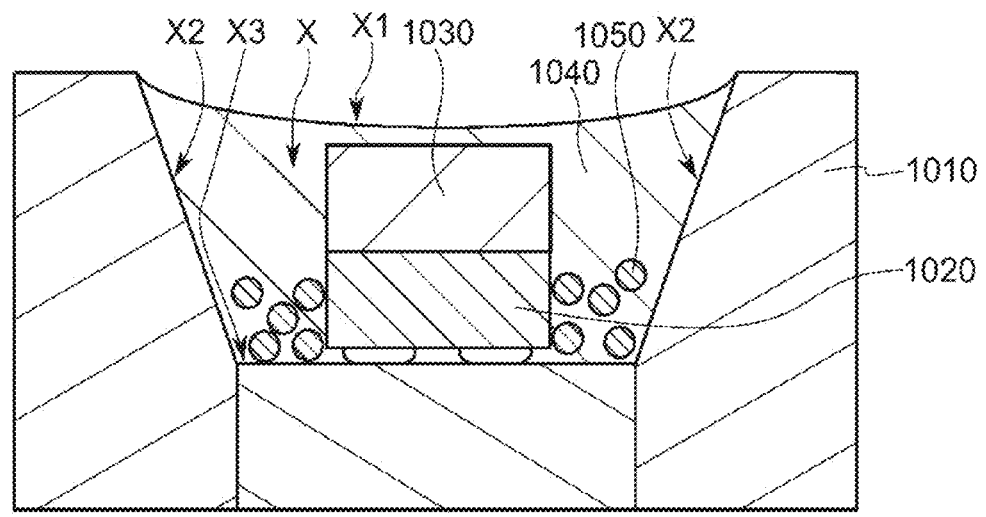
FIG. 18 is a schematic view showing a general configuration of a light emitting device according to a seventh embodiment.

FIG. 18 is a schematic view showing a general configuration of a light emitting device according to a seventh embodiment.

As shown in FIG. 18, the light emitting device according to the seventh embodiment differs from the light emitting device according to the sixth embodiment in that the light emitting element 1020 is flip-chip mounted and that the translucent member 1030 has a height approaching the recessed portion opening X1 of the package 1010.

Even in the light emitting device according to the seventh embodiment, the fluorescent body 1050 is distributed to the side of the light emitting element 1020 in a larger amount than above the light emitting element 1020 and a side surface of the light emitting element 1020 is exposed with respect to the sealing resin 1040 in a similar manner to the light emitting device according to the sixth embodiment.

(Translucent Member 1030)

The translucent member 1030 has a height that approaches the recessed portion opening X1 of the package 1010. Accordingly, since the amount of the fluorescent body 1050 distributed above the light emitting element 1020 is reduced (or becomes zero), the frequency of light emitted from the upper surface of the light emitting element 1020 being reflected by the fluorescent body 1050 declines and, as a result, the light emitted from the upper surface of the light emitting element 1020 can be more easily extracted from the recessed portion opening X1 of the package 1010.

Moreover, examples of a case where the translucent member 1030 has a height that approaches the recessed portion opening X1 of the package 1010 include a case where a distance between the upper surface of the translucent member 1030 and the recessed portion opening X1 of the package 1010 is around 100 μm, a case where a distance between the translucent member 1030 and the recessed portion opening X1 of the package 1010 is shorter than a thickness of the translucent member 1030, and a case where a distance between the translucent member 1030 and the recessed portion opening X1 of the package 1010 is shorter than a thickness of the light emitting element 1020.

The translucent member 1030 is favorably bonded to the upper surface of the light emitting element 1020. For example, when using a light emitting diode having positive and negative electrodes on a same surface, the translucent member 1030 can be easily bonded to the upper surface of the light emitting element 1020.

Eighth Embodiment

Figure 19:
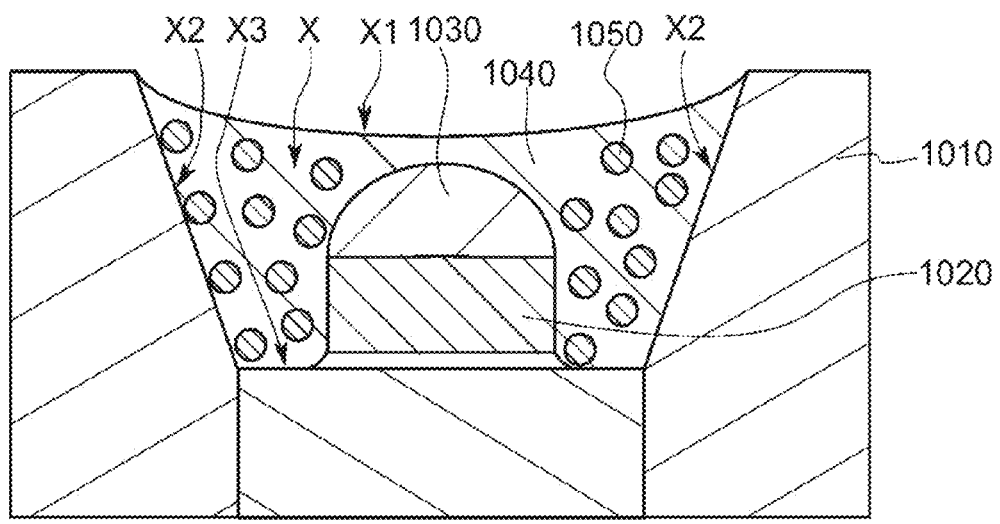
FIG. 19 is a schematic view showing a general configuration of a light emitting device according to an eighth embodiment.

FIG. 19 is a schematic view showing a general configuration of a light emitting device according to an eighth embodiment.

As shown in FIG. 19, the light emitting device according to the eighth embodiment differs from the light emitting device according to the sixth embodiment in that the fluorescent body 1050 is not deposited on the recessed portion bottom surface X3 of the package 1010.

Even in the light emitting device according to the eighth embodiment, the fluorescent body 1050 is distributed to the side of the light emitting element 1020 in a larger amount than above the light emitting element 1020 and a side surface of the light emitting element 1020 is exposed with respect to the sealing resin 1040 in a similar manner to the light emitting device according to the sixth embodiment.

As described above, in the light emitting devices according to the sixth to eighth embodiments, since the fluorescent body 1050 is distributed to the side of the light emitting element 1020 in a larger amount than above the light emitting element 1020 and a side surface of the light emitting element 1020 is exposed with respect to the sealing resin 1040, light emitted from the upper surface of the light emitting element 1020 is more easily extracted from the recessed portion opening X1 of the package 1010 and light emitted from the side surface of the light emitting element 1020 can be efficiently used to excite the fluorescent body

1050. In addition, according to the sixth to eighth embodiments, light extraction efficiency of the light emitting devices can be improved.

Moreover, the sixth to eighth embodiments can be particularly favorably applied to a light emitting device in which an electrode such as a pad electrode or an ITO is provided on the upper surface of the light emitting element 1020. According to the sixth to eighth embodiments, since the frequency of light emitted from the upper surface of the light emitting element 1020 being reflected by the fluorescent body 1050 declines, light reflected by the fluorescent body 1050 above the light emitting element 1020 is prevented from being absorbed by an electrode such as a pad electrode or an ITO and light extraction efficiency of the light emitting devices can be improved.

In addition, the sixth to eighth embodiments can be particularly favorably applied to a light emitting device in which the recessed portion side wall X2 of the package 1010 is thin enough that light passes through the recessed portion side wall X2 even when a reflective member is provided (for example, a light emitting device in which the thickness of recessed portion side wall X2 of the package 1010 is around 0.1 mm). According to the sixth to eighth embodiments, since the light emitted from the side surface of the light emitting element 1020 can be prevented from passing through the recessed portion side wall X2 of the package 1010 and exiting the package 1010, light extraction efficiency can be improved in a light emitting device in which the recessed portion side wall X2 of the package 1010 is thin.

Furthermore, the sixth to eighth embodiments can also be favorably applied to a light emitting element 1020 that uses ceramics for the package 1010. Since ceramics are inorganic materials that hardly deteriorate and are highly reliable, ceramics have lower reflectance than resin materials containing light reflecting members and are likely to transmit light from the light emitting element 1020. However, according to the sixth to eighth embodiments, since the light emitted from the side surface of the light emitting element 1020 can be prevented from passing through the recessed portion side wall X2 of the package 1010 and exiting the package 1010, light extraction efficiency can be improved in a light emitting device that uses ceramics for the package 1010.

Figure 20A:
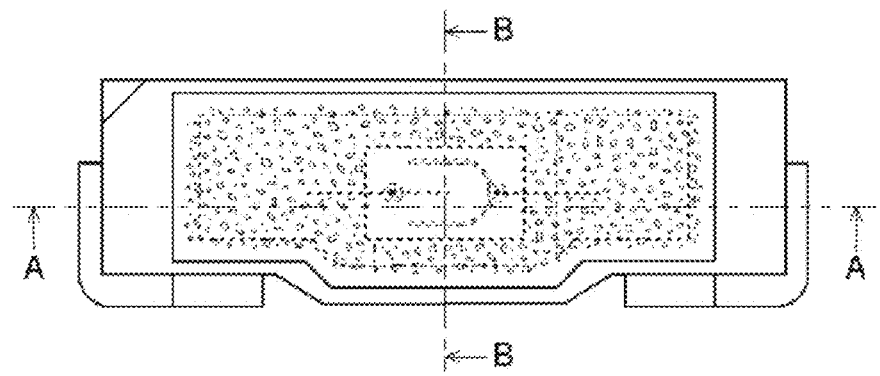
FIGS. 20A to 20C are schematic views of a side view type light emitting device to which the sixth to eighth embodiments, respectively, can be favorably applied.
Figure 20B:
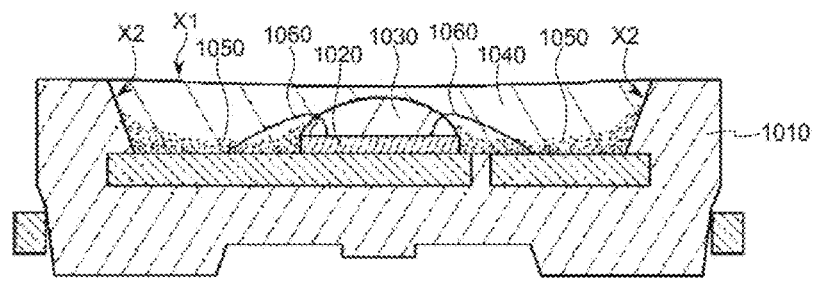
Figure 20C:
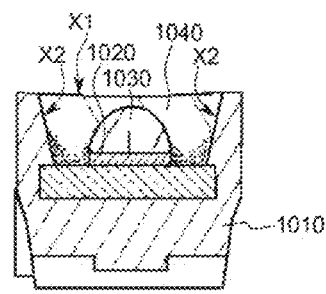

FIG. 20 is a schematic view of a side view type light emitting device to which the sixth to eighth embodiments can be favorably applied, wherein FIG. 20A represents a schematic plan view, FIG. 20B represents a schematic view of a cross section A-A in FIG. 20A, and FIG. 20C represents a schematic view of a cross section B-B in FIG. 20A.

The embodiments can also be applied to a side view type light emitting device such as that shown in FIG. 20. In the side view type light emitting device shown in FIG. 20, the translucent member 1030 is provided on the upper surface of the light emitting element 1020 by potting after the light emitting element 1020 is electrically connected to an external electrode of the package 1010 by wire bonding using the wire 1060 and the wire 1060 is projected from the translucent member 1030.

Figure 21A:
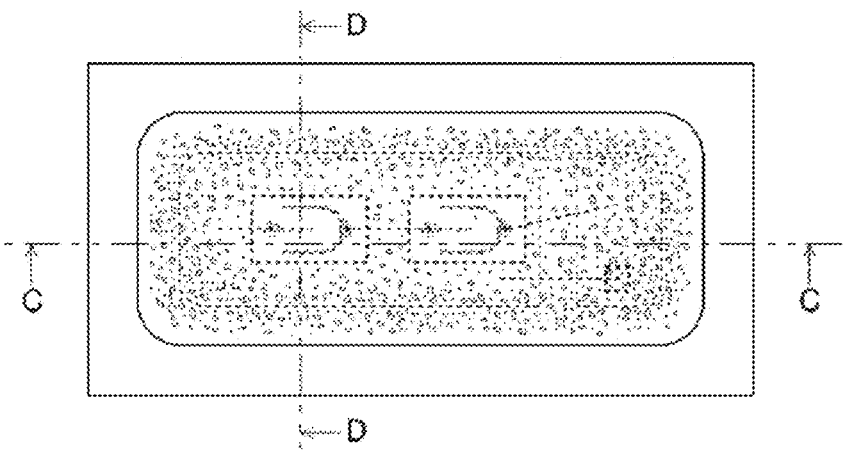
FIG. 21A to 21C are schematic views of a top view type light emitting device to which the sixth to eighth embodiments, respectively, can be favorably applied.
Figure 21B:
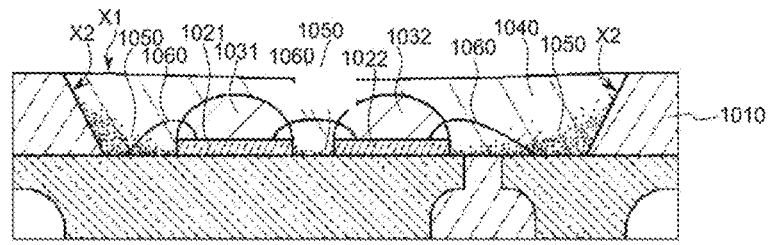
Figure 21C:
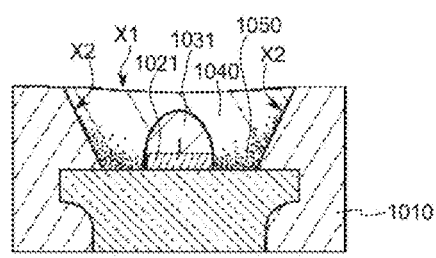

FIG. 21 is a schematic view of a top view type light emitting device to which the sixth to eighth embodiments can be favorably applied, wherein FIG. 21A represents a schematic plan view, FIG. 21B represents a schematic view of a cross section C-C in FIG. 21A, and FIG. 21C represents a schematic view of a cross section D-D in FIG. 21A.

The embodiments can also be applied to a top view type light emitting device such as that shown in FIG. 21. The top view type light emitting device shown in FIG. 21 includes a plurality of light emitting elements 1021 and 1022. The light emitting elements 1021 and 1022 are respectively provided with translucent members 1031 and 1032. The light emitting elements 1021 and 1022 are connected in series using the wire 1060, and both ends of the wire 1060 connecting the light emitting elements 1021 and 1022 are respectively coated by the translucent members 1031 and 1032. The fluorescent body 1050 is distributed not only between the light emitting elements 1021 and 1022 and the side wall surface X2 of the package 1010 but also between the light emitting element 1021 and the light emitting element 1022.

While embodiments and examples have been described above, the description merely represents examples of the present invention and the present invention is by no means limited by the description.

A light emitting device according to the present invention can be utilized in a backlight source of a liquid crystal display, various lighting fixtures, large-size displays, various display devices for advertisement or destination guidance purposes, as well as in digital video cameras, facsimiles, image reading devices in copiers, scanners, or the like, projector devices, and the like.

What is claimed is:

1. A light emitting device comprising:
    a base that has a recessed portion and an element mounting surface located at a bottom of the recessed portion;
    a light emitting element that is mounted on the element mounting surface; and
    a coating member that is constituted by a single layer that fills the recessed portion and coats an upper part of the light emitting element, the coating member containing a fluorescent material that is excited by light from the light emitting element,
    wherein an uppermost surface of the coating member is exposed to an ambient environment,
    wherein the light emitting element is configured such that a maximum light intensity of light emitted into the coating member from the light emitting element is in a directly upward direction,
    wherein the light emitting device is configured such that a light emission chromaticity of the light emitting device exhibits a substantially rectangular wave profile when measured at an uppermost surface of the coating member, in a lateral direction, in a portion that, when viewed from a location above the light emitting device, corresponds to a projected area of the light emitting element in the lateral direction,
    wherein said substantially rectangular wave profile includes a central region having a light emission chromaticity indicative primarily of blue light, and lateral regions having a light emission chromaticity indicative primarily of yellow light, and
    wherein an entirety of the fluorescent material is located at a position other than directly above the light emitting element.

2. The light emitting device according to claim 1, wherein:
    the light emitting element has maximum light intensity in a directly upward direction.

3. The light emitting device according to claim 1, wherein a difference ($\Delta x$, $\Delta y$) between a maximum value and a minimum value of the light emission chromaticity directly above the light emitting element and at an outer periphery of the light emitting element in one direction as measured in a near field of the light emitting device is $\Delta x \geq 0.2$, $\Delta y \geq 0.3$.

4. The light emitting device according to claim 1, wherein:
- a top view shape of the light emitting element is a rectangular shape,
- in a top view, two areas A sandwiched by a side wall surface facing a vertical direction of the recessed portion and a side surface of the light emitting element opposing the side wall surface are smaller than two areas B sandwiched by a side wall surface facing a horizontal direction of the recessed portion and a side surface of the light emitting element opposing the side wall surface, and
- a deposited layer of the fluorescent material is thicker in the areas A than in the areas B.

5. The light emitting device according to claim 1, wherein the fluorescent material exists in a large amount on a side of the element mounting surface in the coating member.

6. The light emitting device according to claim 1, wherein the fluorescent material exists so as to coat a side surface of the light emitting element.

7. The light emitting device according to claim 1, wherein:
- the base includes side wall surfaces that sandwich the light emitting element,
- the fluorescent material exists from above the element mounting surface to above the side wall surfaces, and
- the fluorescent material above the side wall surfaces reaches a higher position than an upper surface of the light emitting element.

8. A lighting device comprising:

the light emitting device according to claim 1; and a light guiding member into which light enters from the light emitting device.

9. The light emitting device according to claim 1 wherein a density of the fluorescent material in the sealing resin is higher at a side of the light emitting element than above the light emitting element.

* * * * *